(12) United States Patent
Tripathi

(10) Patent No.: US 11,228,272 B2
(45) Date of Patent: Jan. 18, 2022

(54) PULSED ELECTRIC MACHINE CONTROL

(71) Applicant: Tula eTechnology, Inc., San Jose, CA (US)

(72) Inventor: Adya S. Tripathi, San Jose, CA (US)

(73) Assignee: Tula eTechnology, Inc., San Jose, CA (US)

( * ) Notice: Subject to any disclaimer, the term of this patent is extended or adjusted under 35 U.S.C. 154(b) by 0 days.

(21) Appl. No.: 16/912,313

(22) Filed: Jun. 25, 2020

(65) Prior Publication Data

US 2020/0328714 A1    Oct. 15, 2020

Related U.S. Application Data

(63) Continuation of application No. 16/353,166, filed on Mar. 14, 2019, now Pat. No. 10,742,155.
(Continued)

(51) Int. Cl.
     *B23P 19/06*     (2006.01)
     *H02P 27/08*     (2006.01)
     *H03M 3/00*     (2006.01)

(52) U.S. Cl.
     CPC ............ *H02P 27/08* (2013.01); *H02P 27/085* (2013.01); *H03M 3/438* (2013.01); *H03M 3/456* (2013.01)

(58) Field of Classification Search
     CPC ...... H02P 27/08; H02P 27/085; H03M 3/438; H03M 3/456; B23P 19/066
     See application file for complete search history.

(56) References Cited

U.S. PATENT DOCUMENTS

| | | | |
|---|---|---|---|
| 4,989,146 | A | 1/1991 | Imajo |
| 5,099,410 | A | 3/1992 | Divan |

(Continued)

FOREIGN PATENT DOCUMENTS

| | | |
|---|---|---|
| CN | 102381265 | 3/2012 |
| CN | 204589885 | 8/2015 |

(Continued)

OTHER PUBLICATIONS

International Search Report and Written Opinion dated Jun. 26, 2019 from International Application No. PCT/US2019/022185.
(Continued)

*Primary Examiner* — Cortez M Cook
(74) *Attorney, Agent, or Firm* — Beyer Law Group LLP

(57) ABSTRACT

A variety of methods, controllers and electric machine systems are described that facilitate pulsed control of electric machines (e.g., electric motors and generators) to improve the machine's energy conversion efficiency. Under selected operating conditions, the electric machine is intermittently driven (pulsed). The pulsed operation causes the output of the electric machine to alternate between a first output level and a second output level that is lower than the first output level. The output levels are selected such that at least one of the electric machine and a system that includes the electric machine has a higher energy conversion efficiency during the pulsed operation than the electric machine would have when operated at a third output level that would be required to drive the electric machine in a continuous manner to deliver the desired output. In some embodiments, the second output level is zero torque.

26 Claims, 12 Drawing Sheets

Related U.S. Application Data

(60) Provisional application No. 62/644,912, filed on Mar. 19, 2018, provisional application No. 62/658,739, filed on Apr. 17, 2018, provisional application No. 62/810,861, filed on Feb. 26, 2019.

(56) References Cited

U.S. PATENT DOCUMENTS

| | | | |
|---|---|---|---|
| 5,151,637 A * | 9/1992 | Takada | H02P 3/20 |
| | | | 318/376 |
| 5,731,669 A | 3/1998 | Shimzu et al. | |
| 6,424,799 B1 * | 7/2002 | Gilmore | B23P 19/066 |
| | | | 318/432 |
| 6,829,515 B2 | 12/2004 | Grimm | |
| 6,829,556 B2 | 12/2004 | Kumar | |
| 7,259,664 B1 | 8/2007 | Cho et al. | |
| 7,327,545 B2 | 2/2008 | Konishi | |
| 7,558,655 B2 | 7/2009 | Garg et al. | |
| 7,577,511 B1 | 8/2009 | Tripathi et al. | |
| 7,969,341 B2 | 6/2011 | Robbe et al. | |
| 8,099,224 B2 | 1/2012 | Tripathi et al. | |
| 8,768,563 B2 | 7/2014 | Nitzberg et al. | |
| 8,773,063 B2 | 7/2014 | Nakata | |
| 9,046,559 B2 | 6/2015 | Lindsay et al. | |
| 9,050,894 B2 | 6/2015 | Banerjee et al. | |
| 9,308,822 B2 | 4/2016 | Matsuda | |
| 9,495,814 B2 | 11/2016 | Ramesh | |
| 9,630,614 B1 | 4/2017 | Hill et al. | |
| 9,702,420 B2 | 7/2017 | Yoon | |
| 9,758,044 B2 | 9/2017 | Gale et al. | |
| 9,948,173 B1 | 4/2018 | Qahouq | |
| 10,273,894 B2 | 4/2019 | Tripathi et al. | |
| 2005/0127861 A1 | 6/2005 | McMillan et al. | |
| 2008/0179980 A1 | 7/2008 | Dawsey et al. | |
| 2009/0121669 A1 | 5/2009 | Hanada | |
| 2009/0146615 A1 | 6/2009 | Zillmer et al. | |
| 2009/0179608 A1 | 7/2009 | Welchko et al. | |
| 2009/0306841 A1 | 12/2009 | Miwa et al. | |
| 2010/0010724 A1 | 1/2010 | Tripathi et al. | |
| 2010/0296671 A1 | 11/2010 | Khoury et al. | |
| 2011/0089774 A1 | 4/2011 | Kramer | |
| 2011/0130916 A1 | 6/2011 | Mayer | |
| 2011/0208405 A1 | 8/2011 | Tripathi et al. | |
| 2012/0056569 A1 | 3/2012 | Takamatsu et al. | |
| 2012/0169263 A1 | 7/2012 | Gallegos-Lopez et al. | |
| 2012/0217921 A1 | 8/2012 | Wu et al. | |
| 2013/0141027 A1 * | 6/2013 | Nakata | H02P 27/08 |
| | | | 318/400.23 |
| 2014/0018988 A1 * | 1/2014 | Kitano | B60L 3/12 |
| | | | 701/22 |
| 2014/0028225 A1 | 1/2014 | Takamatsu et al. | |
| 2014/0217940 A1 | 8/2014 | Kawamura | |
| 2014/0265957 A1 | 9/2014 | Hu et al. | |
| 2014/0292382 A1 | 10/2014 | Ogawa et al. | |
| 2014/0354199 A1 | 12/2014 | Zeng et al. | |
| 2015/0240404 A1 * | 8/2015 | Kim | D06F 33/48 |
| | | | 68/12.05 |
| 2015/0261422 A1 | 9/2015 | den Haring et al. | |
| 2015/0318803 A1 | 11/2015 | Wu et al. | |
| 2016/0226409 A1 | 8/2016 | Ogawa | |
| 2016/0233812 A1 | 8/2016 | Lee et al. | |
| 2016/0269225 A1 | 9/2016 | Kirchmeier et al. | |
| 2017/0087990 A1 | 5/2017 | Neti et al. | |
| 2017/0331402 A1 | 11/2017 | Smith et al. | |
| 2018/0032047 A1 | 2/2018 | Nishizono et al. | |
| 2018/0045771 A1 | 2/2018 | Kim et al. | |
| 2018/0154786 A1 | 6/2018 | Wang et al. | |
| 2018/0276913 A1 | 9/2018 | Garcia et al. | |
| 2018/0334038 A1 | 11/2018 | Zhao et al. | |
| 2019/0288629 A1 | 9/2019 | Tripathi | |
| 2019/0288631 A1 | 9/2019 | Tripathi | |
| 2021/0203263 A1 | 7/2021 | Serrano et al. | |

FOREIGN PATENT DOCUMENTS

| | | |
|---|---|---|
| CN | 205229379 | 5/2016 |
| CN | 106932208 | 7/2017 |
| CN | 107067780 | 8/2017 |
| CN | 105196877 | 9/2017 |
| CN | 207129052 | 3/2018 |
| CN | 108216026 | 6/2018 |
| CN | 108445386 | 8/2018 |
| JP | 10243680 | 9/1998 |
| JP | 2014-33449 | 2/2014 |
| WO | WO 03/036787 | 5/2003 |

OTHER PUBLICATIONS

Cai et al., "Torque Ripple Reduction for Switched Reluctance Motor with Optimized PWM Control Strategy", https://www.mdpi.com/1996-1073/11/11/3215, Oct. 15, 2018, 27 pages.

Spong et al., "Feedback Linearizing Control of Switched Reluctance Motors", IEEE Transactions on Automatic Control, vol. AC-32, No. 5, May 1987, pp. 371-379.

Extended European Search Report dated May 11, 2021 from European Application No. 21157204.5-1202.

Mirzaeva et al., "The use of Feedback Quantizer PWM for Shaping Inverter Noise Spectrum", Power Electronics and Motion Control Conference (EPE/PEMC), 2012 15$^{th}$ International IEEE, Sep. 4, 2012, pp. DS3c.10-1, XP032311951, DOI: 10.1109/EPEPEMC.2012.6397346, ISBN: 978-1-4673-1970.6.

Luckjiff et al., "Hexagonal ΣΔ Modulators in Power Electronics", IEEE Transactions on Power Electronics, Institute of Electrical and Electronics Engineers, USA, vol. 20, No. 5, Sep. 1, 2005, pp. 1075-1083, XP011138680, ISSN: 0885-8993, DOI: 10.1109/TPEL.2005.854029.

Extended European Search Report dated May 11, 2021 from European Application No. 19772096.4-1202/3753100.

U.S. Office Action dated Jun. 26, 2020 from U.S. Appl. No. 16/353,159.

Japanese Office Action dated Sep. 21, 2021 from Japanese Application No. 2020-548673.

* cited by examiner

PULSED ELECTRIC MACHINE CONTROL

CROSS-REFERENCE TO RELATED APPLICATIONS

This application is a Continuation of U.S. application Ser. No. 16/353,166, filed on Mar. 14, 2019, which claims priority of U.S. Provisional Patent Application Nos. 62/644,912, filed on Mar. 19, 2018; 62/658,739, filed on Apr. 17, 2018; and 62/810,861 filed on Feb. 26, 2019, all of which are incorporated herein by reference in their entirety.

BACKGROUND

The present application relates generally to electric machine control. More specifically, control schemes and controller designs are described that pulse the operation of an electric machine during selected operating conditions to facilitate operating the electric machine in a more energy efficient manner.

The phrase "electric machine" as used herein is intended to be broadly construed to mean both electric motors and generators. Electric motors and generators are structurally very similar. When an electric machine is operating as motor, it converts electrical energy into mechanical energy. When operating as a generator, the electric machine converts mechanical energy into electrical energy.

Electric motors and generators are used in a very wide variety of applications and under a wide variety of operating conditions. In general, many modern electric machines have relatively high energy conversion efficiencies. However, the energy conversion efficiency of most electric machines can vary considerably based on their operational load. Many applications require that the electric machine operate under a wide variety of different operating load conditions, which means that the electric machine often doesn't operate as efficiently as it is capable of. The nature of this problem is illustrated in FIG. 1, which is a motor efficiency map 10 that diagrammatically shows the efficiency of a representative motor under different operating conditions. More specifically, the figure plots the energy conversion efficiency of the motor as a function of motor speed (the X-axis) and torque generated (the Y-axis).

As can be seen in FIG. 1, the illustrated motor is generally most efficient when it is operating within a particular speed range and generating torque within a defined range. For the particular motor shown, the most efficient region of its operating range is the operating region labeled 14 which is generally in the range of 4500-6000 RPM with a torque output in the range of about 40-70 Nm where its energy conversion efficiency is approximately 96%. The region 14 is sometimes referred to herein as the "sweet spot", which is simply the motor's most efficient operating region.

As can be seen in FIG. 1, at any particular motor speed, there will be a corresponding most efficient output torque which is diagrammatically illustrated by maximum efficiency curve 16. For any given motor speed, the motor's efficiency tends to drop off somewhat when the motor's load is higher or lower than the most efficient load. In some regions the motor's efficiency tends to drop relatively quickly, as for example when the torque output falls below about 30 Nm in the illustrated motor.

If the operating conditions could be controlled so that the motor is almost always operated at or near its sweet spot, the energy conversion efficiency of the motor would be quite good. However, many applications require that the motor operate over a wide variety of load conditions with widely varying torque requirements and widely varying motor speeds. One such application that is easy to visualize is automotive and other vehicle or mobility applications where the motor speed may vary between zero when the vehicle is stopped to a relatively high RPM when cruising at highway speeds. The torque requirements may also vary widely at any of those speeds based on factors such as whether the vehicle is accelerating or decelerating, going uphill, downhill, going on relatively flat terrain, etc., the weight of the vehicle and many other factors. Of course, motors used in other applications may be subjected to a wide variety of operating conditions as well.

Although the energy conversion efficiency of conventional electric machines is generally good, there are continuing efforts to further improve energy conversion efficiencies over broader ranges of operating conditions.

SUMMARY

A variety of methods, controllers and electric machine systems are described that facilitate pulsed control of electric machines (e.g., electric motors and generators) to improve the energy conversion efficiency of the electric machine when operating conditions warrant. More specifically, under selected operating conditions, an electric machine is intermittently driven (pulsed). The pulsed operation of the electric machine causes the output of the electric machine to alternate between a first output level and a second output level that is lower than the first output level. The first and second output levels are selected such that at least one of the electric machine and a system that includes the electric machine has a higher energy conversion efficiency during the pulsed operation than the electric machine would have when operated at a third output level that would be required to drive the electric machine in a continuous manner to deliver the desired output. In some embodiments, the second output level is zero torque (or substantially zero torque).

In some embodiments, the electric machine is driven in a pulsed manner when a desired output is less than a designated output level for a given motor speed and driven in a continuous manner when the desired motor output is greater than or equal to the designated output level.

In some embodiments, a power converter is used to control the output of the electric machine. Depending on the application, the power converter may take the form of an inverter, a rectifier, or other appropriate power converter.

The frequency of the pulsing may vary widely with the requirements of any particular application. By way of examples, in various embodiments the electric machine alternates between the first and second output levels at least 10, 100 or 1000 times per second.

In some embodiments, a sigma delta converter is used to control the pulsing of the electric machine. A wide variety of different sigma delta converter architectures may be used. In some embodiments, the sigma delta converter is a first order sigma delta converter. In others, a third order sigma delta converter is used. In still others, higher order sigma delta converters may be used. The sigma delta converters may be implemented algorithmically, digitally, using analog components and/or using hybrid approaches.

In other embodiments, a pulse width modulation controller is used to control the pulsing of the electric machine.

In some embodiments, the first output level varies in accordance with variations in the current operating speed of the electric machine. In various embodiments, the first output level may correspond to an electric machine output level that is or is close to the highest system or electric machine energy conversion efficiency at a current operating speed of the electric machine. In some embodiments, a duty cycle of the pulsing varies in accordance with variations in the desired output.

Machine controllers and electric machine systems are described for implementing all of the functionalities described above. In various embodiments, the system may be configured to operate as a motor, a generator, or as a motor/generator.

In various embodiments, the electric machine may be: an induction machine; a switched reluctance electric machine; a synchronous AC electric machine; a synchronous reluctance machine; a permanent magnet synchronous reluctance machine; a hybrid permanent magnet synchronous reluctance machine; an externally excited AC synchronous machine; a permanent magnet synchronous machine; a brushless DC electric machine; an electrically excited DC electric machine; a permanent magnet DC electric machine; a series wound DC electric machine; a shunt DC electric machine; a brushed DC electric machine; a compound DC electric machine; an eddy current machine; an AC linear machine; an AC or DC mechanically commutated machine; or an axial flux machine.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION

The present disclosure relates generally to pulsed control of electric machines (e.g., electric motors and generators) that would otherwise be operated in a continuous manner to improve the energy conversion efficiency of the electric machine when operating conditions warrant. More specifically, under selected operating conditions, an electric machine is intermittently driven (pulsed) at more efficient energy conversion operating levels to deliver a desired average torque more energy efficiently than would be attained by traditional continuous motor control.

Many types of electrical machines, including mechanically commutated machines, electronically commutated machines, externally commutated asynchronous machines, and externally commutated synchronous machines are traditionally driven by a continuous, albeit potentially varying, drive current when the machine is used as a motor to deliver a desired torque output. The drive current is frequently controlled by controlling the output voltage of a power converter (e.g., an inverter) which serves as the voltage input to the motor. Conversely, the power output of many types of generators is controlled by controlling the strength of a magnetic field—which may, for example, be accomplished by controlling an excitation current supplied to rotor coils by an exciter. (The exciter may be part of a rectifier or other suitable component). Regardless of the type of machine, the drive current for a motor, or the current output by a generator, tends to be continuous.

With pulsed control, the output of the machine is intelligently and intermittently modulated between "torque on" and "zero (no) torque" states in a manner that: (1) meet operational demands, while (2) improving overall efficiency. Stated differently, under selected operating conditions, the electric machine is intermittently driven at a more efficient energy conversion operating level (the "torque on" state) to deliver a desired output. In the periods between the pulses, the machine ideally does not generate or consume any torque (the "zero torque" state). This can conceptually be thought of as turning the electric machine "off." In some implementations, this can be accomplished by effectively turning the electric machine "off," as for example, by shutting off drive current to a motor or the excitation current for a generator. However, in other implementations, the electric machine may be controlled during the "zero torque" state in a manner that attempts to cause the torque generated by the electric machine to be zero or as close to zero as may be practical or appropriate for the particular machine. In some implementations, any power converters used in conjunction with the electric machine may effectively be turned off for at least portions of the "zero torque" periods as well.

Figure 1:
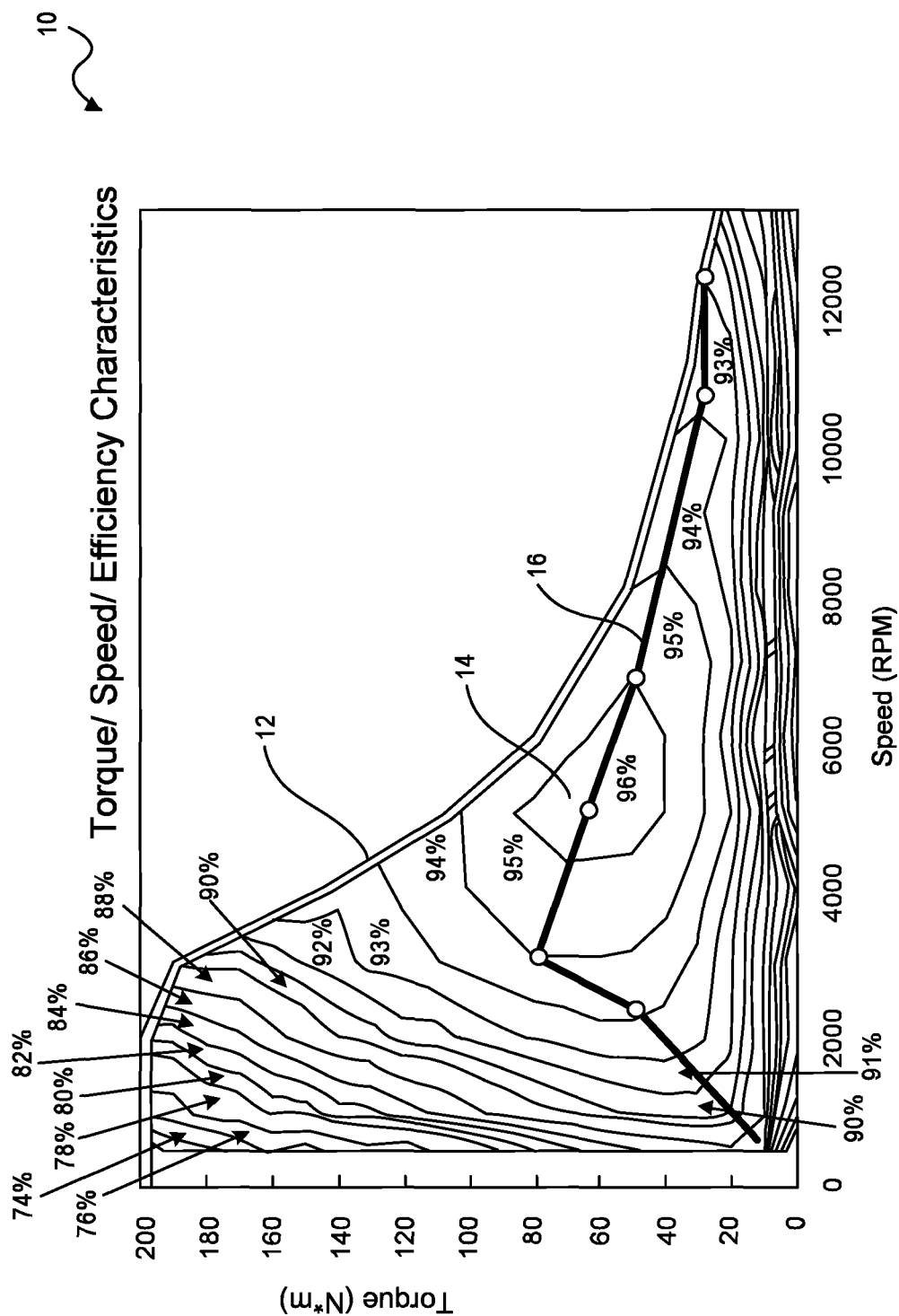
FIG. 1 is a representative Torque/Speed/Efficiency graph illustrating the energy conversion efficiency of a representative electric motor under different operating conditions.

As discussed in the background, FIG. 1 illustrates the energy conversion efficiency of a representative motor. The map illustrated in FIG. 1 is the efficiency map for an internal permanent magnet synchronous motor used in a 2010 Toyota Prius. It should be understood that this map is merely illustrative. Similar efficiency maps can be generated for just about any electric machine although the characteristics of the map will vary with the machine that is characterized.

As can be seen in FIG. 1, at any particular motor speed, there will be a corresponding most efficient output torque which is diagrammatically illustrated by maximum efficiency curve 16. From a conceptual standpoint, when the desired motor torque is below the most efficient output torque for the current motor speed, the overall efficiency of the motor can be improved by pulsing the motor. Conversely, when the desired motor torque is at or above the maximum efficiency curve 16, the motor may be operated in a conventional (continuous/non-pulsed) manner to deliver the desired torque.

Figure 2A:
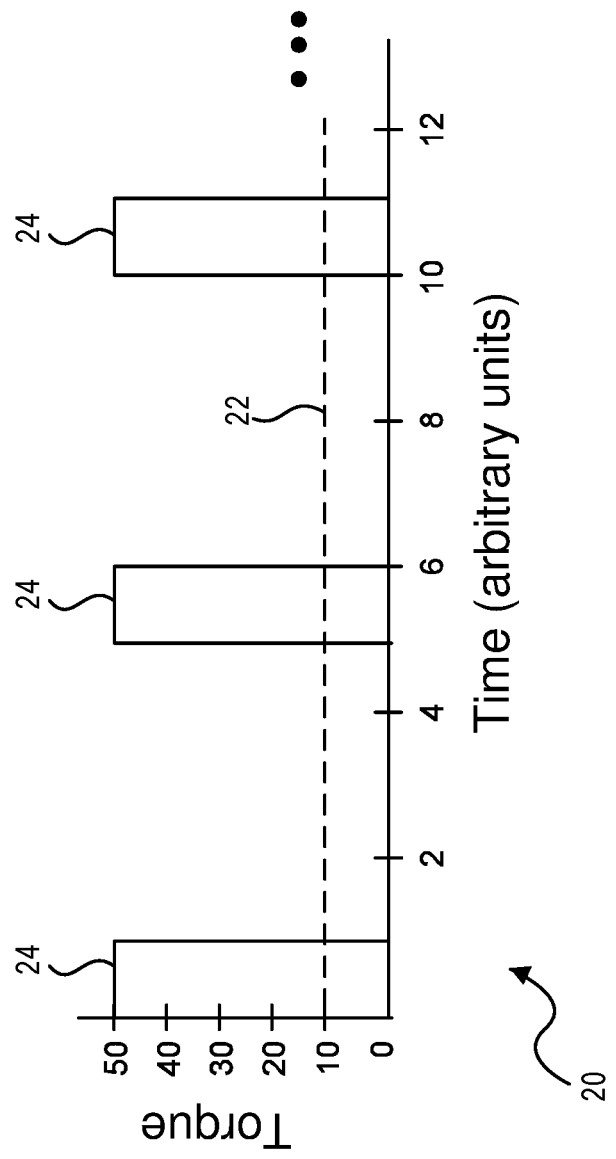
FIG. 2A is a graph illustrating a pulsed drive signal for an electric machine.

FIG. 2A illustrates an example of pulsed motor operation. In this particular example, the desired motor torque is 10 Nm, but the most efficient torque output for the current operating motor speed is 50 Nm. Conceptually, the motor can be driven to deliver a net torque of 10 Nm by causing the motor to deliver 50 Nm of torque for 20% of the time and then delivering no (zero) torque the remaining 80% of the time. Since the motor operates more efficiently when it is delivering 50 Nm than when it delivers 10 Nm, the motor's overall efficiency can be improved by pulsing the motor's operation in the described manner. In the example illustrated in FIG. 2A the motor produces a motor output of 50 Nm (labeled 24) for a period of 1 time unit out of every 5 time units and then the motor is controlled to produce zero torque during the intervening 4 time units.

As long as the desired motor output doesn't exceed 50 Nm, the desired motor output can theoretically be met merely by changing the duty cycle of the motor operating at 50 Nm. For example if the desired motor output changes to 20 Nm, the duty cycle of the motor operating at 50 Nm can be increased to 40%; if the desired motor output changes to 40 Nm, the duty cycle can be increase to 80%; if the desired motor output changes to 5 Nm, the duty cycle can be reduced to 10% and so on. More generally, pulsing the motor can potentially be used advantageously any time that the desired motor torque falls below the maximum efficiency curve 16.

The scale of the time units actually used may vary widely based on the size, nature and design needs of any particular system. In practice, when the motor is switched from the "torque on" to "zero torque" states relatively rapidly to achieve the designated duty cycle, the fact that the motor is actually being switched back and forth between these states may not materially degrade the motor's performance from an operational standpoint. In some embodiments, the scale of the periods for each on/off cycle is expected to be on the order of 100 μsec to 0.10 seconds (i.e. pulsing at a frequency in the range of 10 to 10,000 Hz), as for example in the range of 20 to 1000 Hz, or 20 to 100 Hz as will be discussed in more detail below.

The zero torque portions of the pulse cycle might conceptually be viewed as shutting the motor off—although in many cases the motor may not actually be shut off during those periods or may be shut off for only portions of the "zero torque" intervals.

Figure 2B:
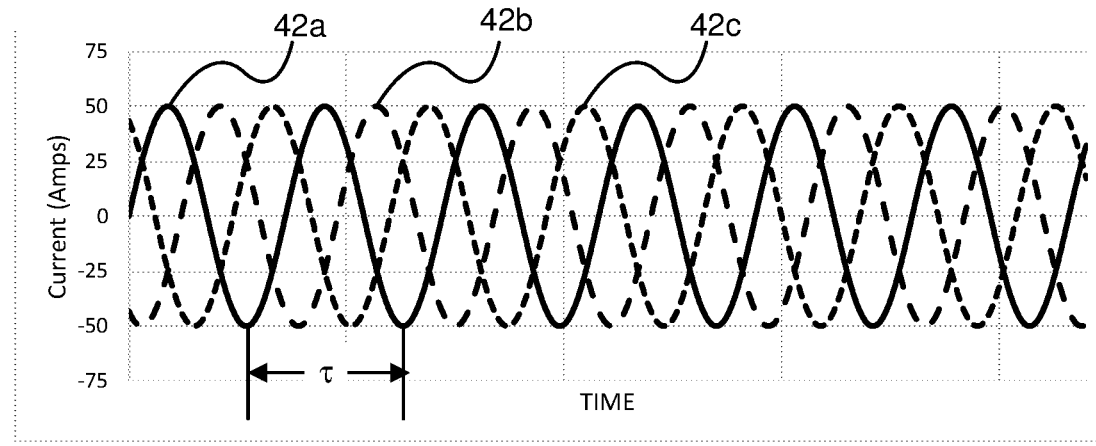
FIG. 2B is a diagrammatic representation of a continuous three-phase AC drive signal waveform.
Figure 2C:
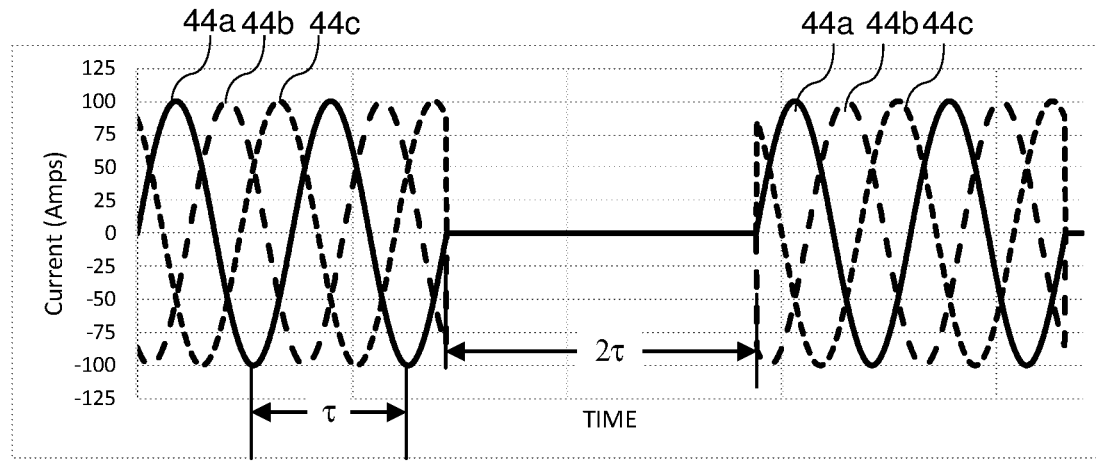
FIGS. 2C and 2D are pulsed three-phase AC waveforms having a 50% duty cycle that represent the same average power as the continuous waveform of FIG. 2B.
Figure 2D:
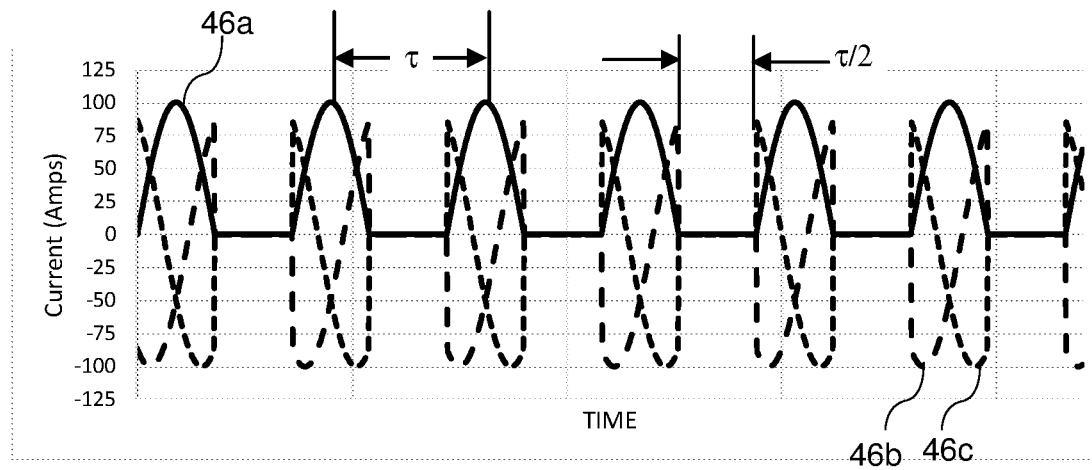

Many electric machines are designed to operate using alternating current. FIGS. 2B-2D are plots illustrating the difference between continuous and pulsed alternating currents that may be input to an electric machine operating as a motor—as for example, a three-phase induction motor. In each plot, current is plotted on the vertical axis and time is plotted along the horizontal axis.

FIG. 2B illustrates conventional sinusoidal three-phased input current 42a, 42b, and 42c delivered to the electric machine. Phase B, denoted by curve 42b leads phase A, denoted by 42a by 120 degrees. Phase C, denoted by curve 42c, leads phase B by 120 degrees. The sine wave period is T. The three-phased input power 42 is continuous (not pulsed) and has a designated maximum amplitude of approximately 50 amps. It should be appreciated that 50 amps is only a representative maximum current and the maximum current may have any value.

FIGS. 2C and 2D illustrate two examples of different pulsed three-phased currents 44a, 44b, and 44c and 46a, 46b, and 46c that each have a 50% duty cycle and a peak amplitude of approximately 100 amps. As in FIG. 2B the period of the base sine wave is τ, however, now the sine wave is modulated on and off. Assuming the motor speed is the same and the generated torque is substantially proportional to current, as is often the case, the delivered current in FIGS. 2C and 2D produces the same average torque as the continuously applied three-phased input current of FIG. 2B. The difference between pulsed currents 44a-c and 46a-c is the duration of their respective current pulses and the interleaved "off" periods. In FIG. 2C, the current pulses 44a-c are interleaved with "off" periods of equal length. The length of each on and off period is 2τ. In FIG. 2D, the current pulses 46a-c and the interleaved "off" periods again have equal duration. In this case the duration is τ/2. In both examples, the duty cycle is 50%. However, the duration of the "on" and "off" time durations is different, i.e. the frequency of the pulsed modulation is different. The frequency of the pulsed modulation may vary based on the type of electrical machine used, noise and vibration considerations, current operating rotor speed and other factors.

FIGS. 2C-2D illustrate applications in which the "on" motor drive pulses are evenly spaced while the motor is operated at a steady state desired output level. Such an approach works well in many circumstances, but is not a requirement. The duty cycle need not be 50%, but can be adjusted to match the desired average output torque. Also, the phase of the on/off pulses need not be synchronized with the phase of the applied AC power. Thus, the relative sizes and/or timing of the motor drive pulses can be varied as long as they average out to deliver the desired average torque.

Power Converters and System Efficiency

There are a wide variety of different electric machines and each machine has its own unique efficiency characteristics. Further, at different operating speeds, the electric machine will have different efficiency curves as should be apparent from a cursory review of FIG. 1. Therefore, the operating regions in which pulsed control can provide efficiency gains will vary significantly based on factors including the particular electric machine's characteristics and the current operational rotor speed.

When AC electric machines are used in conjunction with a battery or other DC power source/sink (store), power converters (e.g. inverters and rectifiers) will typically be used to convert between DC and AC power. For example, inverters are used to convert power received from a DC power supply, such as a battery or capacitor, into AC input power applied to a motor. Conversely, rectifiers are used to convert AC power received from an electric machine operating as a generator into DC output power. Some power converters may function as either an inverter or a rectifier depending upon whether the electric machine is functioning as a motor or a generator.

Figure 5:
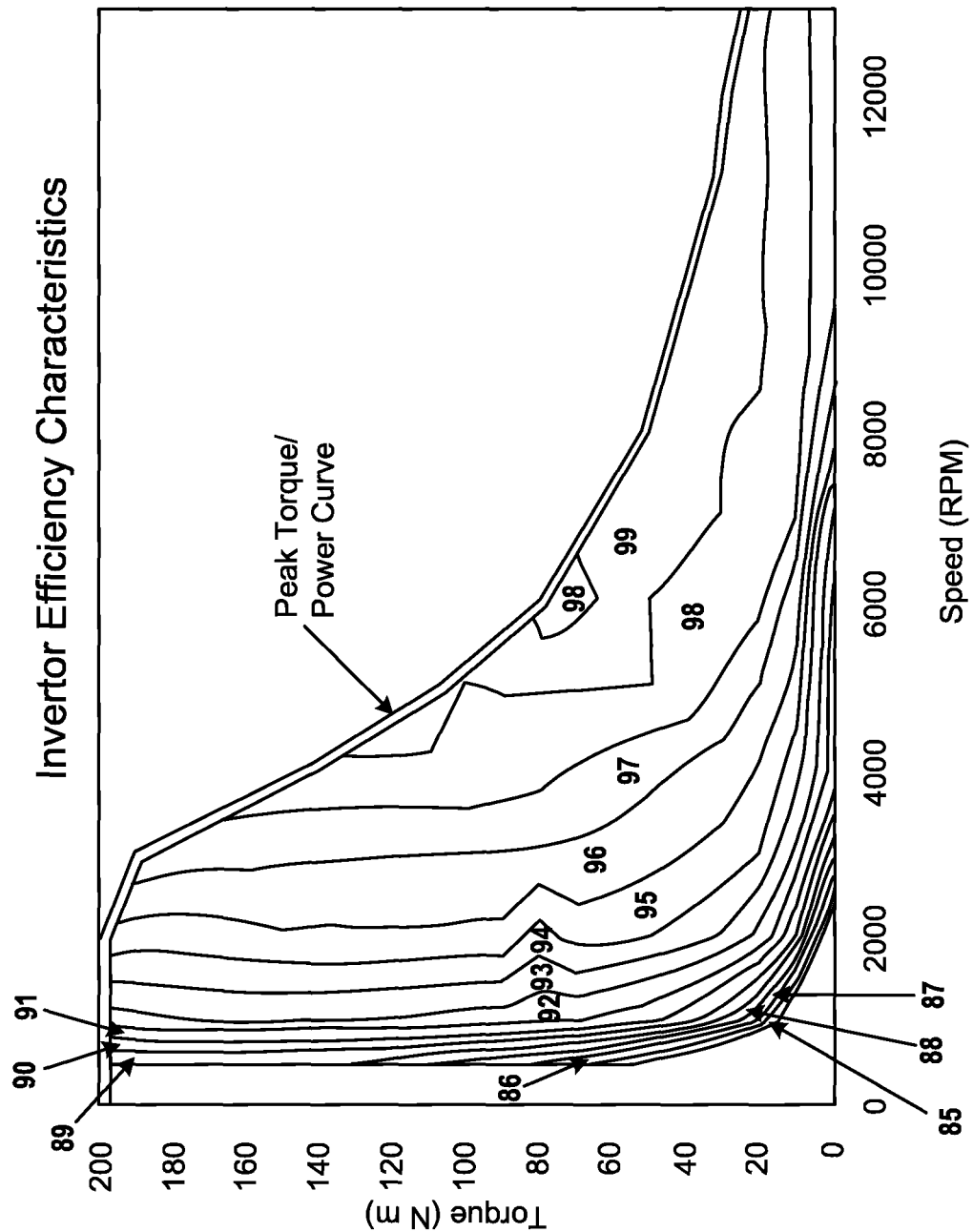
FIG. 5 is a representative Torque/Speed/Efficiency graph illustrating the energy conversion efficiency of a representative inverter under different operating conditions.

The energy conversion efficiency of power converters will also typically vary over the operating range of the converter. For example, FIG. 5 is understood to be an inverter energy conversion efficiency map for a 2010 Toyota Prius inverter (i.e., the inverter for the motor represented in FIG. 1).

Although the energy conversion efficiency of the illustrated inverter is quite good, its efficiency also drops off noticeably in certain regions—most notably at lower torque outputs and at lower motor speeds. Thus, when optimizing control of a motor that is part of an inverter/electric motor combination, it is desirable to consider the energy conversion efficiency of the overall inverter/electric motor system as opposed to the energy conversion efficiency of the motor alone. Similarly, when optimizing the control of a generator that is part of a rectifier/generator system, it is desirable to consider the energy conversion efficiency of the overall rectifier/generator system as opposed to the energy conversion efficiency of the generator alone.

Preferably, the pulsed control of an electric machine will be modeled to account for the efficiencies of any/all of the components that influence the energy conversion during pulsing. For example, when power for an AC electric motor is drawn from a battery, the battery's power delivery efficiency, cabling losses between components and any other loss factors can be considered in addition to the inverter and motor efficiencies, when determining the motor drive signal that delivers the best energy conversion efficiency.

In general, the overall energy conversion efficiency of a power converter/electric machine system is a function of the product of the converter conversion efficiency times the electric machine conversion efficiency times the delivery efficiency of other components. Thus, it should be appreciated that the parameters of the pulsed drive signal that has the maximum system energy conversion efficiency may be different than the parameters that would provide the best energy conversion efficiency for the motor itself.

Figure 6:
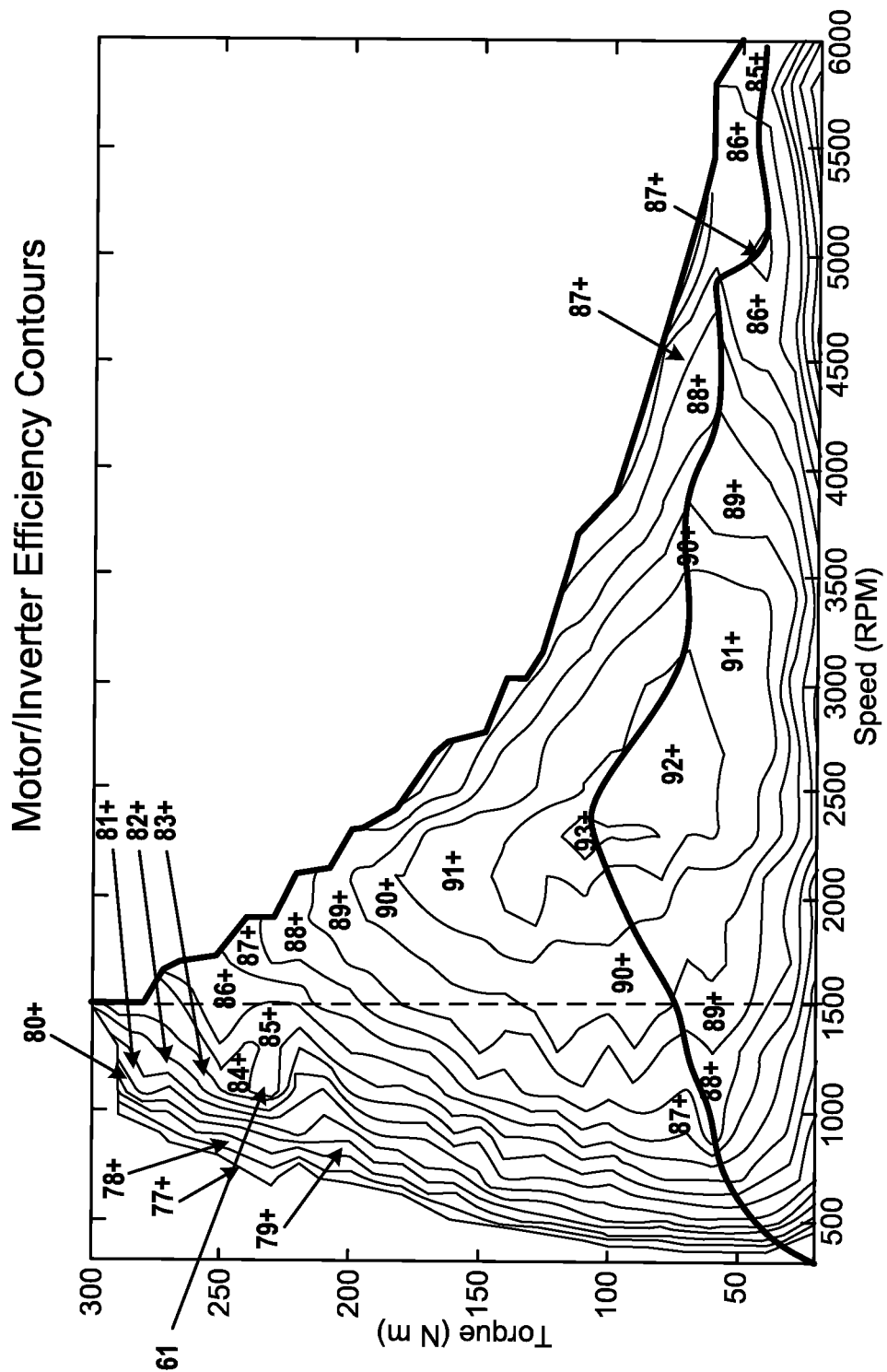
FIG. 6 is graph illustrating the combined energy conversion efficiency of a representative inverter/electric motor combination.

FIG. 6 is a representative energy conversion efficiency map for a combined inverter/AC electric motor. More specifically, FIG. 6 shows the combined efficiency of a Tesla inverter/motor propulsion system. Since the inverter and the electric motor work together, the best overall electric motor system energy conversion efficiency can be optimized by selecting the pulse voltage and corresponding duty cycle based on the combined system energy conversion efficiency map rather than using the electric motor's energy conversion efficiency map alone.

Often, the energy conversion efficiency map for a particular electric machine system (e.g. a combined power converter/electric machine; battery/power converter/electric machine; etc.) will be more complex than the efficiency map for the electric machine itself. As such, there may be local efficiency peaks above the maximum efficiency curve. That is, there may be a region of the energy conversion efficiency map where at a given motor speed, operation at a particular torque output that is above the "maximum" possible efficiency for operation at that motor speed may be more efficient than a range of intermediary torque outputs that are above the maximum efficiency curve, but below that particular torque output. One such region is designated 61 in FIG. 6. It should be appreciated that when the energy conversion efficiency map has this type of topography, pulsed operation at the local efficiency peak may be more efficient than continuous operation at those intermediary output levels. In such circumstances, the motor can be pulsed at the level of the local efficiency peak to deliver such intermediary torque outputs.

Pulsed System Control

Figure 3:
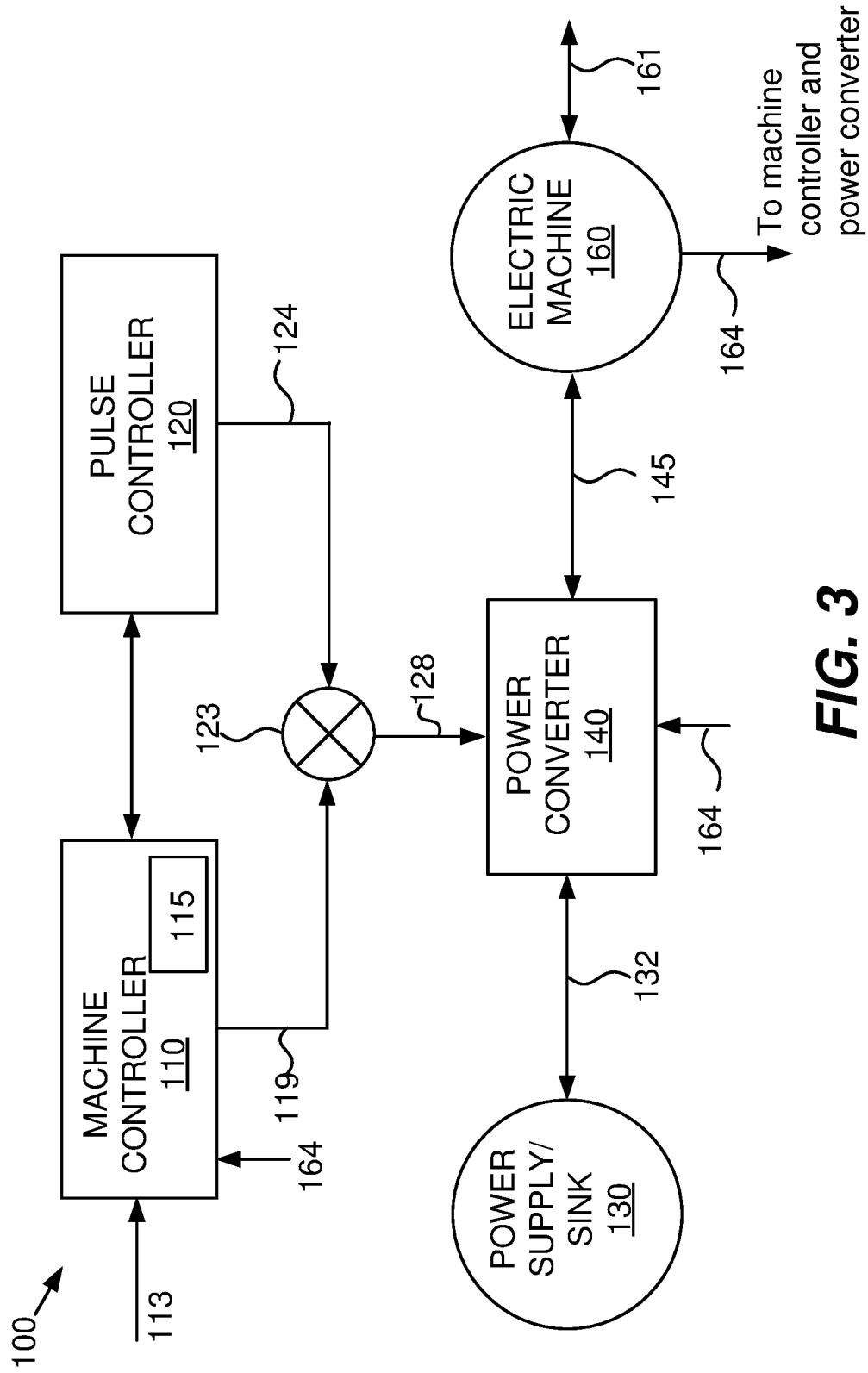
FIG. 3 is a functional block diagram that diagrammatically illustrates an electric machine control architecture in accordance with one described embodiment.

FIG. 3 illustrates a control architecture suitable for controlling an electric machine in the described manner. In this embodiment, the system 100 includes a machine controller 110, a pulse controller (pulse generator) 120, a power supply/sink 130, a power controller/converter 140, and an electric machine 160. The pulse controller 120 is responsible for controlling/directing the timing of the pulsing of electric machine 160 when pulsed operation is called for. In the embodiment illustrated in FIG. 3, the pulse controller is shown as a component that is separate from the machine controller 110 to facilitate explanation of its function. However, in various embodiments, the pulse controller may be implemented as part of the machine controller 110, as a separate component, as part of power controller/converter 140 or in other appropriate forms.

When the electric machine 160 is operated as a motor, the machine controller functions as a motor controller, and the power controller/converter 140 is responsible for converting power 132 received from power supply 130 to a form that is suitable for driving the motor 160. Conversely, when the machine 160 is operated as a generator, the machine controller 110 functions as a generator controller and the power controller/converter 140 converts power received from the generator to a form suitable for delivery to the power sink 130. In embodiments in which the power supply/sink can supply or receive power directly in the form required by or outputted by the electric machine, the power controller 140 can conceptually take the form of a switch or logical multiplier that simply turns the motor on and off to facilitate the desired pulsing.

The power supply/sink 130 can take any suitable form. In some implementations, the power supply/sink may take the form of a battery or a capacitor. In other implementations, the source may be a power grid (e.g., "wall power"), a photovoltaic system, or any other available source. Similarly, the sink may be an electrical load (such as an electrically operated machine or appliance, a building, a factory, a home, etc.), a power grid or any other system that uses or stores electrical power.

The power controller/converter 140 can also take a wide variety of different forms. When the power supply/sink 130 is a DC power supply and the electric machine 160 is an AC motor, the power controller/converter 140 can take the form of an inverter. Conversely, when the power supply/sink 130 is a DC power sink and the electric machine 160 is an AC generator, the power controller/converter 140 can take the form of a rectifier. When both the power supply/sink 130 and the electric machine are AC components, the power controller/converter 140 may include a bidirectional or 4 quadrant power converter.

In FIG. 3, the requested output is labeled 113, the torque delivered or received by the electric machine is labeled 161 and the motor/generator speed is labeled 164. In some embodiments, the machine controller 110 includes a data structure 115 (as for example a lookup table) that serves as a pulsed operation map that defines the operating region in which pulsed motor control is desired and/or appropriate as well as the specific duty cycles that are appropriate for specific operating conditions.

Once the desired duty cycle is determined, the duration and nature of the pulses used to drive the motor can be determined/generated in a wide variety of manners. As will be described in more detail below, one relatively simple approach is to use a pulse width modulation (PWM) controller as the pulse controller 120.

In FIG. 3, logical multiplier 123 is shown as multiplying a pulsed control signal 124 times a power level signal 119 output by machine controller 110 to create a power converter control signal 128. It should be appreciated that the logical multiplier 123 is shown for the purposes of explanation and in practice, the function of the multiplier 123 can be accomplished by the machine controller 110, by the power converter 140, or in other suitable manners. For example, in some embodiments, the machine controller 110 may simply set the output of the power converter 140 to zero during the "off" phases of the duty cycle and to the desired operational output level (e.g., the most efficient output level for the current machine speed) during the "on" phases of the duty cycle.

Figure 4:
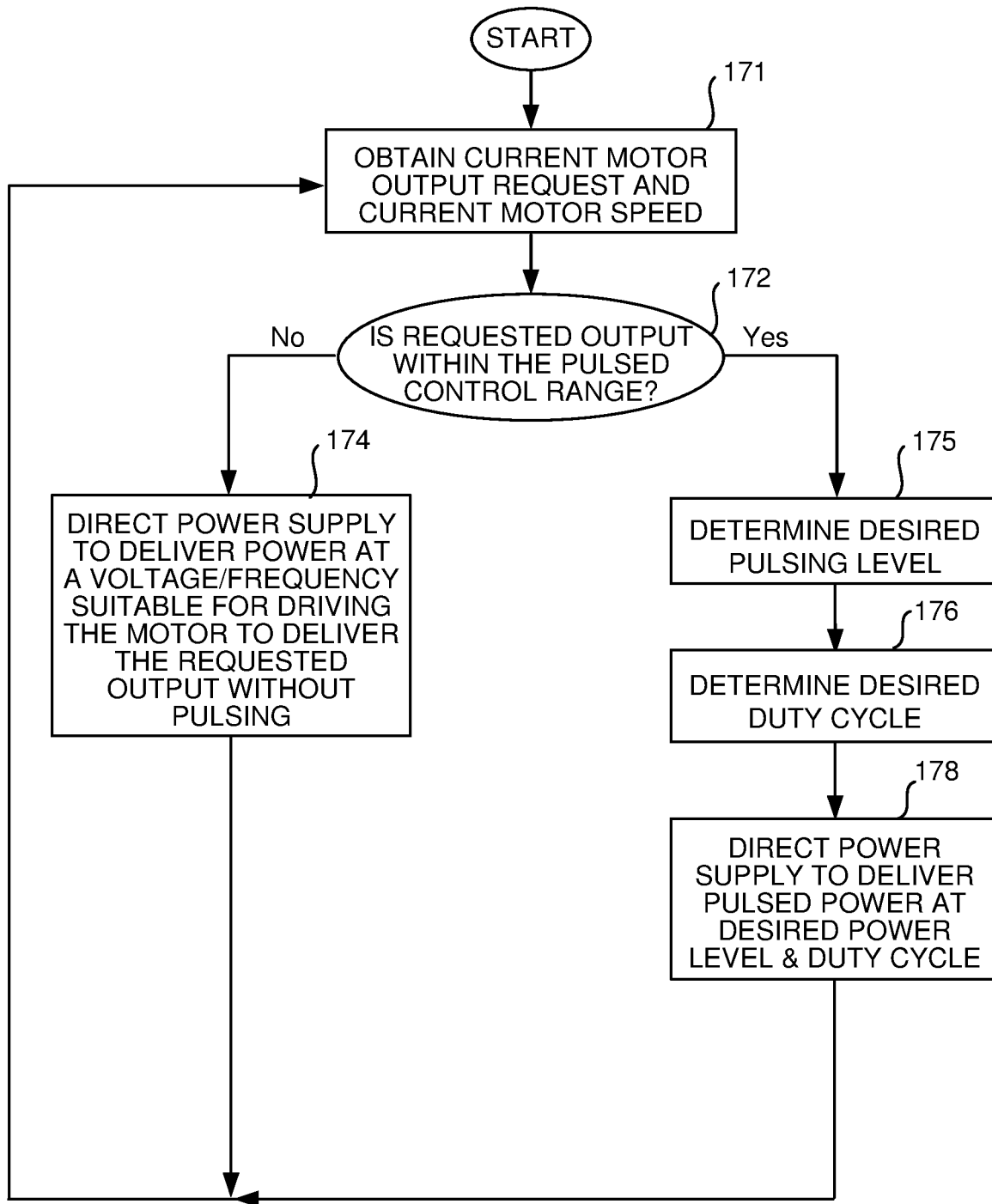
FIG. 4 is a flow chart illustrating a motor control scheme in accordance with another embodiment.

FIG. 4 illustrates a control flow that may be performed by machine controller 110 to cause the electric machine 160 to efficiently deliver a desired torque. To simplify the discussion, an embodiment in which the electric machine 160 functions as a motor is described. In this arrangement, the power supply/sink 130 acts as a power supply and the machine controller 110 functions as a motor controller.

Initially, the motor controller 110 receives the currently requested motor output 113 and any required motor state information such as the current motor speed 164 as represented by block 171. The motor controller 110 then determines whether the requested output is within the pulsed control range as represented by decision block 172. This decision can be made in any desired manner By way of example, in some embodiments, a look-up table 115 or other suitable data structure can be used to determine whether pulsed control is appropriate. In some implementations a simple lookup table may identify a maximum torque level at which pulsed control is appropriate for various motor speeds. In such an implementation, the current motor speed may be used as an index to the lookup table to obtain a maximum torque level at which the pulsed control is appropriate under the current operating conditions. The retrieved maximum torque value can then be compared to the requested torque to determine whether the requested output is within the pulse control range.

In other embodiments, the lookup table 115 may provide additional information such as the desired duty cycle for pulsed operation based on the current operating conditions. In one such implementation, the motor speed and the torque request may be used as indices for a lookup table with each entry in the lookup table indicating the desired duty cycle with interpolation being used to determine an operational duty cycle when the actual torque and/or motor speeds are between the index values represented in the table.

If the requested torque/current operating conditions are outside of the pulsed control range for any reason, then traditional (i.e. continuous/non-pulsed) motor control is used as represented by the "no" branch flowing from block 172. As such, pulsing is not used and the power converter 140 is directed to deliver power to the motor 160 at a level suitable for driving the motor to deliver the requested output 113 in a conventional manner as represented by block 174. Conversely, when the requested torque/current operating conditions are within the pulsed control range, then pulsed control is utilized as represented by the "yes" branch flowing from block 172. In such embodiments, the motor controller 110 will direct the power converter 140 to deliver power to the motor in a pulsed manner During the "on" pulses, the power converter 140 is directed to deliver power at a preferred output level—which would typically (but not necessarily) be at or close to the maximum efficiency operating level for the current motor speed. During the "off" pulses, the motor ideally outputs zero torque. In some embodiments, the timing of the pulsing is controlled by pulse controller 120 as will be discussed in more detail below.

To facilitate pulsed operation, the motor controller 110 determines the desired output level (block 175) and the desired duty cycle (block 176) for pulsed operation at the current motor speed (which is preferably at or close to the system's maximum efficiency energy conversion output level at the current motor speed—although other energy efficient levels can be used as appropriate). The motor controller and the pulse controller then direct the power converter to implement the desired duty cycle (block 178) at the designated power level. Conceptually, this may be accomplished by effectively turning the power supply on and off at a relatively high frequency such that the fraction of the time that power is supplied to the motor corresponds to the desired duty cycle, and the power level corresponds to the preferred output level. In some embodiments, the "off" portion of the duty cycle may be implemented by directing the power controller/converter 140 to drive the motor to deliver zero torque.

The frequency at which the power is pulsed is preferably determined by the machine controller 110 or the pulse controller 120. In some embodiments, the pulsing frequency can be fixed for all operation of the motor, while in others it may vary based on operational conditions such as motor speed, torque requirements, etc. For example, in some embodiments, the pulsing frequency can be determined through the use of a look-up table. In such embodiments, the appropriate pulsing frequency for current motor operating conditions can be looked up using appropriate indices such as motors speed, torque requirement, etc. In other embodiments, the pulsing frequency is not necessarily fixed for any given operating conditions and may vary as dictated by the pulse controller 120. This type of variation is common when using sigma delta conversion in the determination of the pulses as discussed below. In some specific embodiments, the pulsing frequency may vary proportionally as a function of motor speed, at least in some operating regions of the motor.

Although FIG. 4 illustrates some of the steps sequentially to facilitate a clear understanding of the functionality provided, it should be understood that many of the steps can be combined and/or reordered in practice. For example, the entries in a multi-dimensional lookup table 115 that uses requested output 113 and current electric motor speed 164 as indices may indicate both the preferred output level and the duty cycle that is appropriate for current operation.

In some embodiments, a value stored in the lookup table (such as a duty cycle of 1 (100%) or other suitable wildcards) can optionally be used to indicate that pulsing is not desired. Of course a wide variety of other conventions and data structures can be used to provide the same information.

In some embodiments, the pulsed control table can be incorporated into a larger table that defines operation at all levels such that the operational flow is the same regardless whether conventional or pulsed control is desired with the conventional control merely being defined by a duty cycle of 1 and the appropriate motor input power level, and the pulsed control being defined by a smaller duty cycle and use of the preferred motor input power level.

In some embodiments, it may be desirable to avoid the use of pulsing in some operating regions even when efficiency improvements are possible, based on other considerations. As will be discussed in more detail below, these other considerations may be based on factors such a noise and vibration, the practical switching capabilities of the controller, etc.

The machine controller described herein may be implemented in a wide variety of different manners including using software or firmware executed on a processing unit such as a microprocessor, using programmable logic, using application specific integrated circuits (ASICs), using discrete logic, etc. and/or using any combination of the foregoing.

It is notable that in many circumstances, existing electric machines and machine controllers can readily be retrofitted to obtain the described benefits. For example, many machine controllers are implemented using software or firmware executed on a processing unit which already has access to control input parameters suitable for use in the described control (e.g., a requested motor output and a current motor speed). In such cases, it may be possible to obtain noticeable efficiency improvements by installing a relatively simple software update.

Pulse Generation

As suggested above, once the desired duty cycle is determined, the duration and nature of the pulses used to drive the motor can be determined/generated in a wide variety of manners. One relatively simple approach is to use a pulse width modulation (PWM) controller as the pulse controller 120.

It is noted that pulse width modulation is commonly used in certain types of motor control, including AC electric motor control and DC brushless motor control, but such pulse width modulation is used at a very different location in the control scheme. Specifically, when an AC induction motor is powered by a battery (which provides DC power) an inverter is typically used to facilitate the conversion of DC power to AC power. Commonly, a PWM controller (not shown) is used as part of the inverter controller to control the amplitude of the AC signal that is generated by the inverter. Continuous AC power generated by the inverter is then supplied to the electric motor at the desired frequency and amplitude. PWM controllers are similarly used in brushless DC motors to control the amplitude of the continuous signal that is supplied to the motor.

The pulsed power utilized herein is quite different. Specifically, power converter 140 is controlled to cyclically switch between producing a high efficiency torque output (e.g. the peak efficiency torque) and no torque in the electric machine 160 as discussed above with reference to FIGS. 2A-2D. In an induction motor, this results in the magnetic flux in the motor windings effectively dropping to zero.

Although traditional pulse width modulation will work in many applications, a potential drawback is the possibility of the pulsing generating undesirable vibrations or noise as the motor and/or power supply are turned on and off. Steady state operation of the motor at the same pulse cycle for a period of time is particularly susceptible to generating such vibration. There are a number of ways to mitigate such risks including some that will be described in more detail below. Another approach is to add some dither to the commanded pulse cycle.

As suggested above, the period for each cycle during pulsed operation (or inversely the pulsing frequency) may vary widely based on the design needs and the nature of the controlled system ranging from microseconds to tenths of a second or longer. A variety of factors will influence the choice of the cycle period. These include factors such as the capabilities and characteristics of the motor, the transitory effects associated with switching, potential NVH (noise, vibration and harshness) concerns, the expected operational loads, etc. In general, the pulsing frequency selected for any particular application will involve a tradeoff including factors such as NVH considerations, required responsiveness of the electric machine, efficiency loss associated with pulsing, etc. For example, in some automotive applications, pulsing frequencies on the order of 20 Hz-1000 Hz are believed to work well.

Sigma Delta Control

Figure 7:
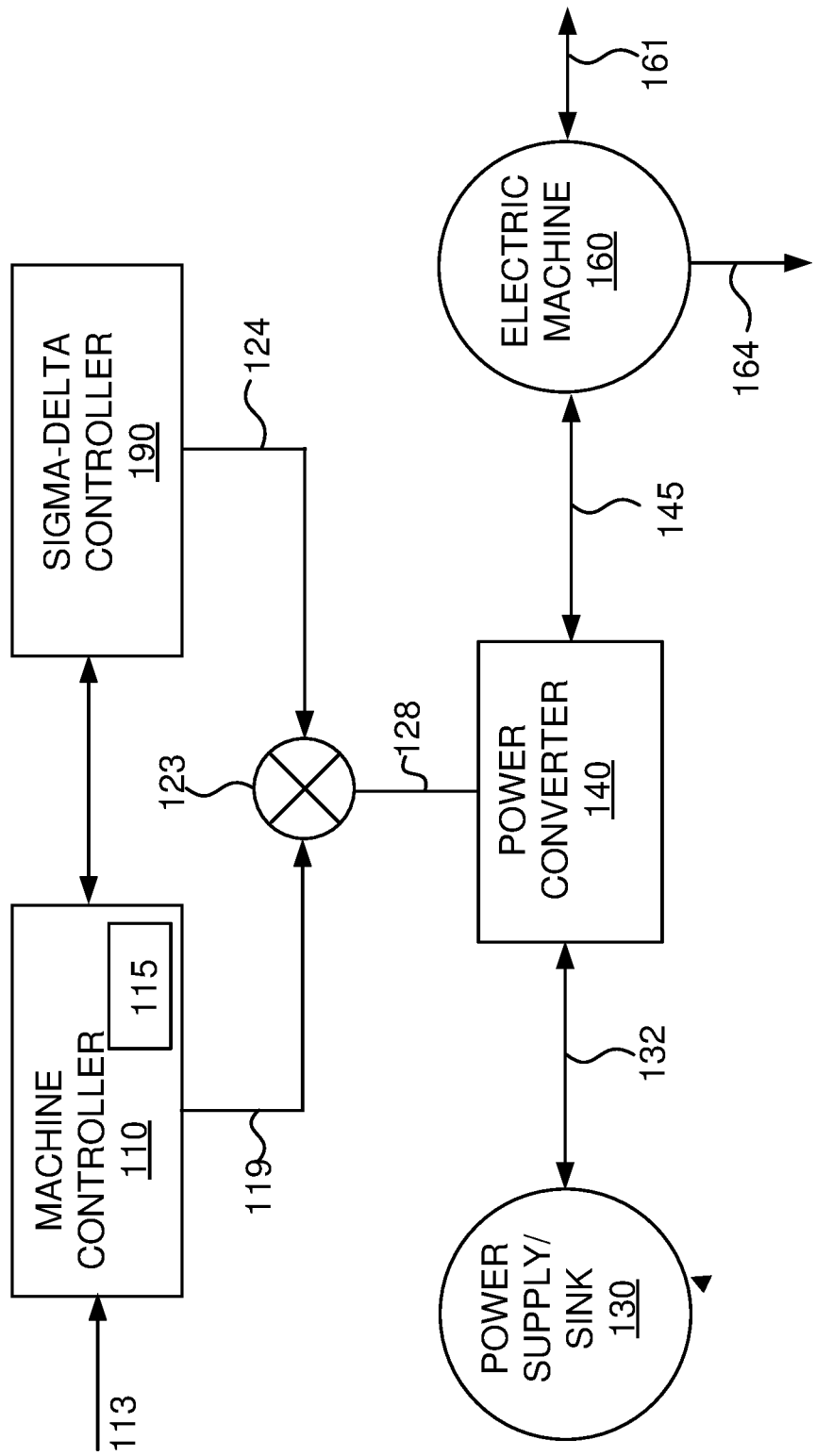
FIG. 7 is a functional block diagram that diagrammatically illustrates a motor controller architecture that includes a sigma-delta based pulse generator in accordance with another embodiment.

Referring next to FIG. 7, another embodiment of the pulse generator will be described. The illustrated architecture is similar to the architecture illustrated in FIG. 3 except that in this embodiment, a sigma-delta converter 190, is used as the pulse generator 120. As will be appreciated by those familiar with sigma delta control, a characteristic of sigma delta control is that it facilitates noise shaping and tends to reduce/eliminate idle tones and push noise to higher frequencies. When noise is randomized and/or spread to frequencies that are above the limits of human perception, it is less of a concern since any such noise and/or vibration is not bothersome to the users of the motor. Therefore, in the context of an automotive electric motor application, use of sigma delta control tends to reduce the likelihood of vehicle occupants perceiving noise or vibrations due to the pulsed motor control.

A wide variety of different sigma delta converters may be used as sigma delta converter 190 and the sigma delta converters may utilize a variety of different feedback schemes. By way of example, first order sigma delta conversion works well. One particularly desirable feature of using a first order sigma delta converter is that the controller is inherently stable. Although a first order sigma delta converter works well, it should be appreciated that in other embodiments, higher order sigma delta converters may be used (e.g., sigma delta converters that utilize a higher number of integrators than a first order sigma delta converter). For example, third order sigma delta converters (as for example converters using the Richie architecture) or higher order sigma delta converters may be used.

Generally, the sigma delta converters may be implemented algorithmically, digitally, using analog components and/or using hybrid approaches. For example, in various embodiments, the sigma delta converter may be implemented on a processor, on programmable logic such as an FPGA, in circuitry such as an ASIC, on a digital signal processor (DSP), using analog, digital and/or hybrid components, or any/or using other suitable combinations of hardware and/or software. In various embodiments, the sigma delta controller may utilize sample data sigma delta, continuous time sigma delta, differential sigma delta, or any other suitable sigma delta implementation scheme.

U.S. Pat. No. 8,099,224 and U.S. Patent Publication No. 2018-0216551, which are incorporated herein by reference in their entirety, describe a number of representative sigma delta converter designs. Although the applications described therein are for controlling different types of power plants, similar types of converters may be used for the present application.

Figure 8:
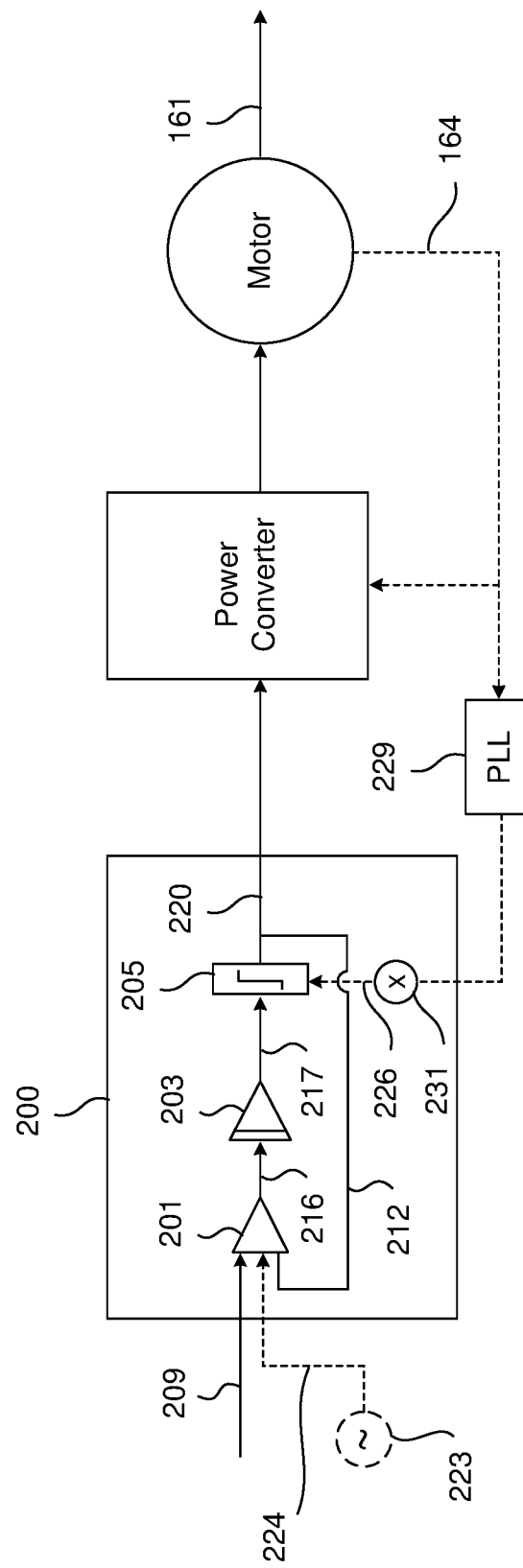
FIG. 8 is a diagrammatic functional block diagram of a first order sigma-delta converter.

Referring next to FIG. 8, a representative first order sigma-delta converter 200 will be described. The first order sigma-delta converter 200 includes a difference amplifier 201, an integrator 203, and a comparator 205. The difference amplifier 201 amplifies the difference between an input signal 209 and a feedback signal 212 and outputs a difference signal 216 which is fed to integrator 203. Integrator 203 integrates the difference signal and outputs an integrator output signal 217 which is fed to comparator 205. The comparator 205 acts as a one-bit quantizer and outputs a pulsed (high/low) digital control signal 220 that is representative of the input signal 209. The one-bit control signal 220 outputted from the comparator 216 is generated by comparing the output of the integrator 203 with a reference voltage. The output is effectively a string of ones and zeros that is outputted at the frequency of the sigma delta converter's clock. The low signal is treated as a request for zero power from the power supply and the high signal is treated as a request for the most efficient (or other designated) power level for the current motor speed.

Generally, in order to ensure high quality control, it is desirable that the clock signal 226 for the sigma delta converter (and thus the output stream of the comparator 205) have a frequency that is many times the expected frequency of the rate of change of the input signal 209, to provide good resolution and oversampling of the input signal. In general, clock frequencies on the order of 100 kHz to 1 MHz or higher work well for automotive type applications where the input signal (which is generally based on the driver's torque request—e.g. the accelerator pedal) tends to vary at rates of less than 5 Hz. That is, the output of the comparator 205 is sampled at a rate of at least 100 kHz-1 MHz (although both higher and lower sampling rates may be used in various embodiments). The clock signal 226 provided to the comparator 216 may come from any suitable source. For example, in some embodiments, the clock signal 226 is provided by a crystal oscillator.

In various embodiments, the comparator 205 can be configured to enforce desired constraints on the pulsing (which is sometimes referred to herein as performing as a functionally intelligent comparator). In a simple example, the comparator can be constrained to define minimum and/or maximum "on" times, minimum (and/or maximum) "off" times etc. as will be appreciated by those familiar with advanced sigma delta control. Such constraints can be helpful to ensure that the pulsing is performed within desired frequency and "on" pulse length parameters. In other embodiments, more advanced constraints can be imposed by the comparator. For example, if desired, pulse cycle dither 223 can be added to the comparator.

In some embodiments, it may be desirable to anti-aliasing filter the input signal 209 and the feedback signal 212. The anti-aliasing functionality can be provided as part of the sigma-delta control circuit or it may be provided as an anti-aliasing filter that precedes the sigma delta control circuit or it may be provided in any other suitable form. In some third order analog continuous time sigma-delta control circuits, the first integrator provides the anti-aliasing functionality. That is, it effectively acts as a low pass filter.

In other embodiments, a variable clock that is based on motor speed may be used instead of a fixed clock. Such an arrangement is diagrammatically illustrated in the sigma delta converter of FIG. 8 which uses a variable clock that is based on motor speed. Specifically, the clock signal is configured to vary proportionally with motor speed. The use of a variable speed clock when the motor is operating at speed has the advantage of ensuring that the output of the comparator is better synchronized with the motor speed. This, in turn, can help simplify the overall design of the converter. The clock can readily be synchronized with the motor speed by utilizing a phase locked loop 229 that is driven by an indication of motor speed (e.g., a tachometer signal). A multiplier 231 may then be used to multiply the motor speed signal 164 to attain the desired sampling rate. The multiplication of the motor speed may vary widely based on the needs of any particular system. By way of example, frequency multiplication on the order of 10 to 1,000,000 times, as for example 10,000 times are appropriate in some applications. In another example, sigma delta clock rates on the order of 1 kHz to several hundreds of kilohertz are believed to be suitable for many automotive applications.

A challenge of using a motor speed based variable clock approach is that it doesn't work particularly well when the motor is stopped or operating at particularly low motor speeds. Several different techniques can be used to alleviate such limitations. By way of example, a fixed clock can be used when the motor is stopped and/or operating a speeds below a designated idle threshold (e.g., below 600 RPM). In other embodiments, a functionally intelligent comparator may be used that has specified start and stop routines or switches to a different operating mode during low speed operation. In still other embodiments, a non-linear RPM clock may be used for operations at lower speeds.

There are several ways that the sigma delta converter 200 can be configured. In one embodiment (similar to the embodiment illustrated in FIG. 8), the input signal 209 is the desired motor duty cycle. In that embodiment, the feedback signal 212 is the pulsed digital control signal 220, which corresponds to pulsed control signal 124 from FIG. 7. In this embodiment, the pulsed control signal 220 represents the desired motor duty cycle.

In another embodiment (not shown) the input signal 209 can be considered to be representative of a desired torque or a desired torque fraction and the feedback signal can be based on the torque output of the motor 161 instead of the pulsed digital control signal 220. In such an embodiment, the feedback is more representative of the actual torque output of the motor than the pulsed control signal 220, since it accounts for any potential torque losses or inefficiencies due to switching the power supply and motor back and forth between the zero and most efficient (or other desired) operational states.

In still other embodiments, the feedback signal 212 may be a scaled combination of the pulsed control signal 220 and the torque output of the motor 161. When higher order sigma delta converters are used, differently scaled feedback can be provided to the different integrators as appropriate for the desired adaptive control using the pulsed control signal, the motor torque output or both as the feedback sources.

As suggested above, first order sigma delta converters (like all sigma delta converters) are helpful in pushing noise to higher frequencies. However, first order sigma delta conversion is not immune to the generation of idle tones—which can be the source of unwanted noise or vibration. One way to help minimize or eliminate idle tones is to add dither to the system. Such dither can be added at numerous locations in the system. In the embodiment illustrated in FIG. 8 optional pseudo random dither generator 223 (shown in dashed lines) may provide an optional dither signal 224 as an additional input to the difference amplifier 201. In other embodiments the dither may instead be injected at other locations in the sigma delta converter 200, as for example as an additional input to the comparator 205. Higher order sigma delta converters are less susceptible to idle tones and therefore there is less of a benefit to adding dither to such systems. Accordingly, dither would typically not be used in such systems (although it can be used).

In the embodiments discussed above, pulse width modulation and sigma delta conversion are used to generate the pulsed control signal. Pulse width modulation and sigma delta conversion are two types of converters that can be used to represent the input signal. Some of the described sigma delta converters exhibit oversampled conversion and in various alternative embodiments, other oversampled converters can be used in place of sigma delta conversion. In still other embodiments, other types of converters can be used as well. It should be appreciated that the converters may employ a wide variety of modulation schemes, including various pulse height or pulse density modulation schemes, code division multiple access (CDMA) oriented modulation or other modulation schemes may be used to represent the input signal, so long as the pulse generator is adjusted accordingly.

As will be appreciated by those skilled in the art, switched reluctance motors are powerful motors that are relatively inexpensive when compared to similarly sized induction motors. However, switched reluctance motors tend to be noisy and susceptible to vibrations due to their switching, which make them unsuitable for use in a number of applications. A feature of sigma delta conversion is its ability to shape noise and to push noise to frequencies that are less (or not) bothersome to humans. As such, controlling switched reluctance motors in a pulsed manner using sigma-delta or other noise shaping conversion techniques has the potential to make the use of switched reluctance motors practical in a number of applications for which they are not currently used.

Managing Transitions

The inherent inductance of the motor can transitorily delay/slow the current/power steps between the on and off motor states. During continuous (non-pulsed) operation, these transitory effects tend to have a relatively minimal impact on overall motor operation. However, when rapid pulsing is used as contemplated herein, the transitory effects can have a larger net impact and therefore, there is more incentive to focus on the motor responsiveness. The nature of the issue will be described with reference to FIGS. 9A-9B.

Figure 9A:
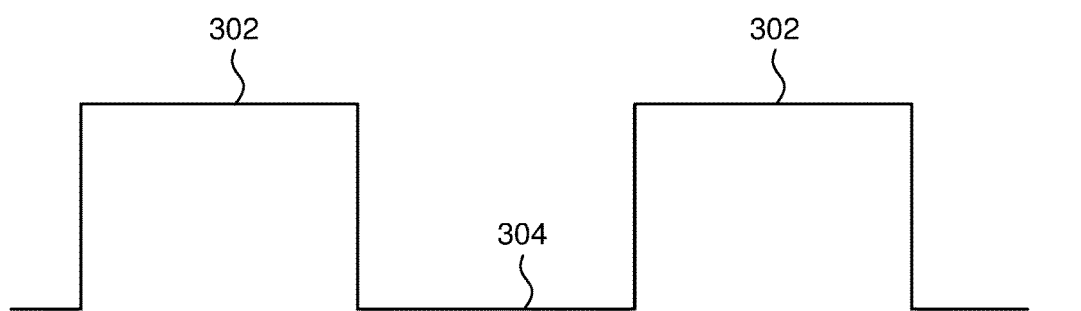
FIG. 9A is a graph diagrammatically representing the desired power rise and fall for pulsed power.

As previously described, a general goal of the pulsed motor control is to operate (power) the motor at its most efficient level for the current motor speed during the motor "on" periods and to cut-off power (provide zero torque) during the motor "off" periods. Thus, ideally, the power transitions between the motor power "on" and "off" states would be discrete steps. This is diagrammatically shown in FIG. 9A which illustrates the idealized/desired motor drive power for pulsed motor control at a duty cycle of 50%. As seen in FIG. 9A, the transitions between the "on" pulses 302 and the "off" periods 304 are ideally steps. In practice, there are inductive aspects of both the motor and (when used) the inverter that slow the rise and fall of the power signal. The actual response of a particular motor will vary widely with the electrical characteristics of the motor. In general, the motor's actual input power will rise and fall somewhat exponentially in response to a step change in the commanded motor drive power. The nature of the rise and fall is diagrammatically illustrated in FIG. 9B. As seen therein, there is a ramp-up period (rise time) 306 required for the power signal to actually rise from zero to the desired "on" power level and a ramp-down period (fall time) 308 required for the power signal to actually fall from the "on" power level down to zero.

The motor continues to be driven during the power ramp-up and ramp-down periods. However, the motor operates less efficiently during those periods in a varying manner as can readily be understood with reference to FIG. 1. In general, for most given operating speeds, the motor efficiency will drop as the operating power drops from the maximum efficiency line 16 towards zero, with the energy conversion efficiency getting noticeably worse as the power level approaches zero. Thus, the pulse distortion represented by the power ramp-up and ramp-down periods detract from the efficiency gains that can be gained by the described pulsed operation. In general, the smaller the ratio of the rise/fall times to the pulse length, the less the transitory switching effects impact the motor's energy conversion efficiency during pulsing.

Figure 9B:
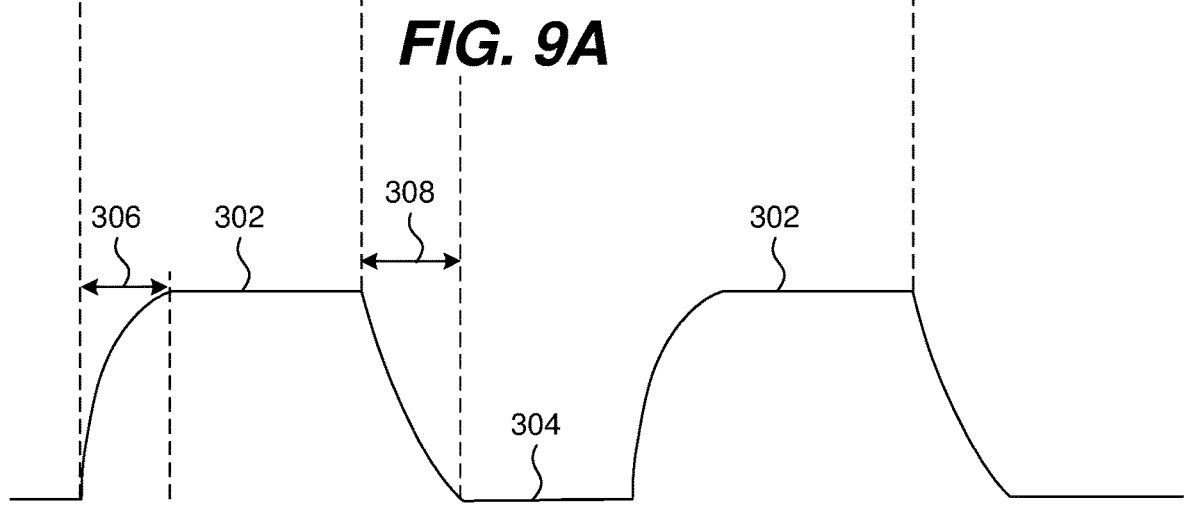
FIG. 9B is a graph diagrammatically representing the actual power rise and fall that may be seen when a conventional motor is pulsed in the described manner.

It should be appreciated that the transitory effects shown in FIG. 9B are shown for the purpose of illustrating the nature of the problem and is not necessarily reflective of the rise/fall times associated with operation of any particular motor. The relative scale of the rise time to the pulse length ratio can vary widely based on the available power supply voltage and the characteristics of the motor used (which primarily dictates the rise and fall times), the frequency of the pulsing (which is primarily dictated by the control scheme used) and the pulse width (which is dictated by the control scheme and motor load). If the pulsing is slow compared to the motor response, the rise/fall times may be a tiny fraction of the pulse width and the transitory switching effects may have a minimal impact on motor performance. Conversely, if the pulsing is very rapid and/or the motor response is slow, the ratio the rise/fall times to the pulse width can become quite significant and can even exceed the pulse width. If not managed carefully, the transitory efficiency losses associated with switching can significantly reduce or even eliminate the theoretical gains that can be attained by pulsed operation. Thus it is important to consider the transitory switching effects associated with pulsed operation when determining the pulsing frequency and control schemes that are appropriate for any particular application.

A number of techniques can be used to improve the power rise and fall times. For example, in some embodiments, a resonant capacitor based on motor inductance is employed. Resonant capacitors can be used to reduce the power rise and fall times by factors of 100 or more (often substantially more), thus they can significantly reduce the transitory switching effects associated with pulsed operation. Therefore, it should be appreciated that motors that are designed with pulsed control in mind or modified to improve the transient response of the motor to power pulses can benefit even more from pulsed operation than existing motors.

In other embodiments, boost converters and/or buck-boost converters may be used to significantly reduce the rise and fall times associated with switching between the "on" and "off" motor states. In a particular example, a boost converter can charge a boost capacitor (sometimes referred to herein as a kick-start capacitor) to a voltage higher than the motor's input voltage. Each time the motor is pulsed on, the kick-start capacitor applies the higher voltage to the motor which can shorten the rise time significantly.

Similarly, a buck-boost converter can be used to charge a buck-boost capacitor. Each time the motor is pulsed off, the buck-boost capacitor can store energy from the motor winding's magnetic field, which can significantly shorten the pulse's transient fall time The voltage charge levels and capacitances of the boost and buck-boost capacitors respectively are chosen appropriately for the motor and its inductive and resistive characteristics to shorten the transient rise/fall times associated with pulsing the motor on and off respectively. Preferably, the respective capacitances and charge voltage levels of the boost and buck-boost capacitors are also selected to maximize overall motor efficiency during pulsing considering all aspects including inefficiencies associated with the transients themselves and the effects of any overshoot that may occur due to use of the boost and buck-boost converters. Since the boost and buck-boost capacitors are used to improve transient response, they may each be opportunistically recharged in the periods between their respective usages—as for example during the motor off periods.

Another factor that is particularly relevant to losses during motor "off" transients relates to the dissipation of energy stored within the magnetic field. In general, there will be an electromagnetic field established within a motor any time that the motor is operating. The electromagnetic field contains a certain amount of energy stored in the magnetic. If the motor is simply turned off, the stored energy will dissipate, which results in loss of the energy that was present within the magnetic field. Any such energy losses reduce the overall system efficiency. Some of that field energy can be recovered by affirmatively controlling the off transient of a motor to deliver zero torque during the "off" cycles rather than simply cutting the supply of current to the motor to effective turn the motor off. This results in the flow of some "reverse" current from the windings back to/through the power converter 140 such that at least some of that energy can be recovered, which means less energy is lost, thereby improving the system's efficiency. Furthermore, in many applications, managing the power converter 140 to deliver zero torque (as opposed simply turning the power converter off) will result in faster transitions.

Similarly, during the "off" cycles of a generator, the power drawn from the generator can be controlled to efficiently manage the capture of the stored energy built up in the motor during the "on" cycles.

Figure 11:
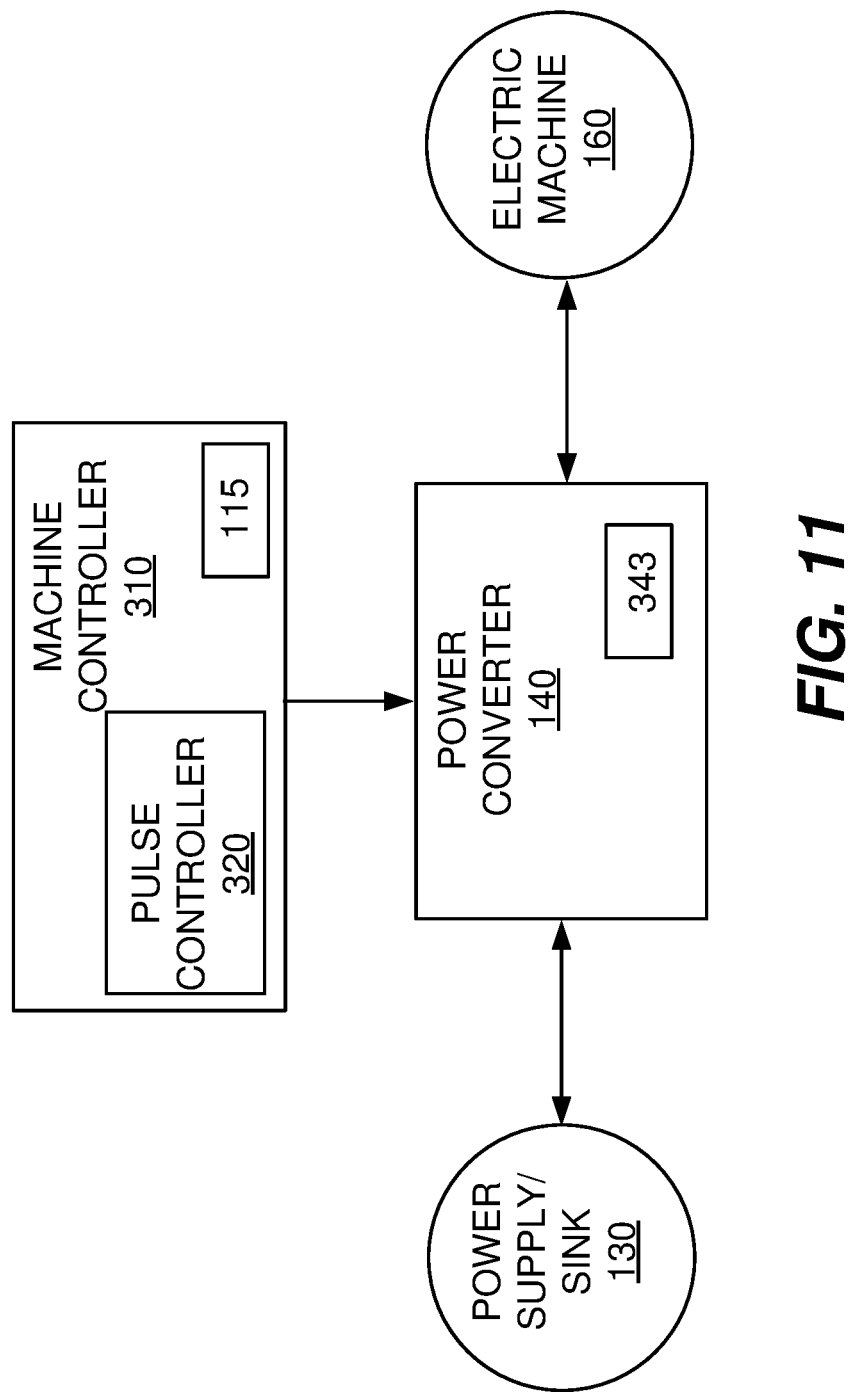
FIG. 11 is a diagrammatic block diagram of an electric motor/generator having transient control circuit configured to shorten the motor/generator on/off rise and fall times in accordance with an embodiment.

FIG. 11 illustrates a power converter/controller that incorporates transient control circuitry 343 (which may include resonant circuits, boost and buck-boost circuits and/or other transient response improving circuits together, alone or in any appropriate combination). In the illustrated embodiment, machine controller 310 directs pulsed control of power converter/controller 340—which in turn controls electric machine 160. The transient control circuitry 343 is incorporated into the power converter 340 itself. In other embodiments, the transient control circuitry may be provided as an add-on unit that is placed between the power converter 340 and the motor/generator or incorporated into the motor/generator itself to accomplish the same functionality (placement not shown).

Motor Types and Applications

It should be apparent from the foregoing description that the described pulsed machine control can be utilized in a wide variety of different applications to improve the energy conversion efficiency of a wide variety of different types of electric motors and generators. These include both AC and DC motors/generators.

A few representative types of electric machines that may benefit from the described pulsing include both asynchronous and synchronous AC electric machines including: Induction machines (IM); switched reluctance machines (SMR); Synchronous Reluctance machines (SynRM); Permanent Magnet Synchronous Reluctance machines (PMaSynRM); Hybrid PMaSynRMs; Externally Excited AC Synchronous machines (SyncAC); Permanent Magnet Synchronous machines (PMSM); Eddy current machines; AC linear machines; AC and DC mechanically commutated machines; axial flux motors; etc. Representative DC electric machines include brushless, electrically excited, permanent magnet, series wound, shunt, brushed, compound and others.

Although the structure, control and energy conversion efficiency of the various types of electric motors and generators vary significantly, most electric machines are designed to operate over a range of operating conditions and their energy conversion efficiency will vary over that operating range—often significantly. In general, the control principles described herein can be applied to any type of electric machine to improve the electric machine's efficiency if the electric machine's operating range includes regions below the equivalent of the maximum efficiency curve illustrated in FIG. 1. In some circumstances efficiency gains can be attained by designing an electric machine with pulsed operation in mind.

Some motor designs utilize windings on both the rotor and stator to generate the motor flux, while others use permanent magnets on either the rotor or stator to contribute to the motor flux. Motors that incorporate permanent magnets will have flux at zero torque and therefore will typically have core losses when rotating and produce a back EMF (BEMF) in excess of the supply voltage. In such applications it will often be desirable to provide a small current to the motor during the "torque off" periods in order to maintain zero torque. It should be appreciated that the need to supply current during the "no torque" periods reduces the overall efficiency associated with pulsing and therefore should be considered when determining which operating ranges can benefit from pulsing. In some operating regions, the losses associated with switching and supplying current during the torque off periods may exceed the efficiency gains associated with pulsing, thereby reducing (or entirely eliminating) the operating range in which pulsed operation is desirable. However, many electric machines that incorporate permanent magnets will have operating regions in which the machine's overall efficiency can be improved through the use of pulsing. For example, for Internal Permanent Magnet Synchronous Motors (IPMSM), the operating region most suitable for pulsed operation are expected to be operating speeds below (or near to) the threshold speed at which field weakening is required.

There is currently widespread interest in using electrical powerplants (e.g., electric motors) in vehicle propulsion systems. Electrics motors used for vehicle propulsion are commonly referred to as traction motors. In the automotive space there have been significant efforts recently to utilize traction motors alone or in combination with internal combustion engines (hybrids) to drive a vehicle. Today, asynchronous motors and three phase induction motors are most commonly used in automotive applications—both of which are good candidates for the described pulsed motor control. Automotive applications are notorious for the very wide range of operating conditions that the motor is expected to operate under—from low speed high torque demands to high speed low torque demands and everything in between. Under most driving conditions (i.e., during the significant majority of many drive cycles), the motor is asked to produce far less torque than it is capable of at the current motor speed—and indeed most driving occurs in regions where the requested output of the motor is below (often significantly below) the maximum efficiency line 16.

Figure 10:
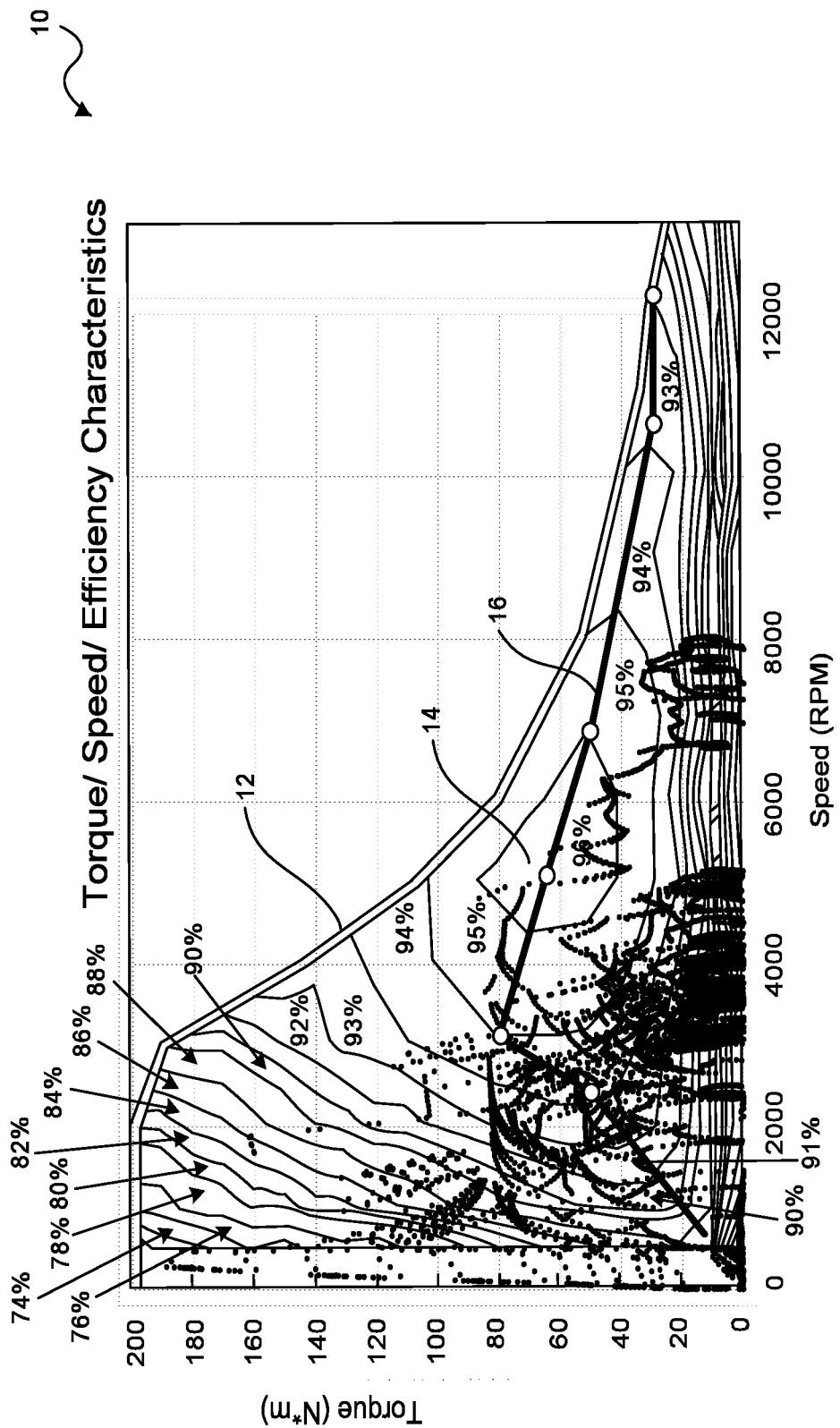
FIG. 10 is a Torque/Speed/Efficiency graph showing the distribution of drive points representing the simulated output of an automotive electric motor during an FTP 75 drive cycle.

The low load nature of typical driving cycles can be seen in FIG. 10, which plots a series of drive points representing the electric power/torque output of a simulated traction motor/generator running a Federal Test Procedure for a city driving cycle (FTP-75). The drive points are plotted on a Torque/Speed/Efficiency graph. As can be seen in FIG. 10, a significant portion of the drive cycle requires lower torque as compared to the maximum efficiency curve 16. Thus significant portions of the typical drive cycle are in operating regions that can attain benefits (and often significant benefits) from the described motor control approach. FIG. 10 depicts only those portions of the drive cycle where output torque is required. During some portions of the drive cycle regenerative braking may be used with the electric machine acting as a generator. Much of the regenerative braking also occurs at points which can benefit from the pulsed control described herein. It is believed that average overall efficiency gains of as much as 7%-12% or more will be attainable by implementing the described control approach in some automotive applications. Seven to twelve percent better efficiency translates to 7%-12% more range on the same charge, which has significant advantages in the context of automotive applications where range anxiety is a significant impediment to wide-spread adoption of the technology. It is expected that even greater efficiency improvements may be seen under autonomous driving conditions where there is less variability in the requested motor output.

In automotive and other vehicle applications, the operational range of the electric motor may be very wide. This is due, in part, to the fact that in most all-electric vehicle applications, the electric motor is coupled to the driven component(s) with a fixed speed ratio. This contrasts with in internal combustion engine powered vehicle, which typically employ an intermediary transmission having variable speed ratios between the engine and the driven component(s). As can be seen fairly clearly seen in FIG. 1, the "sweet spot" of electric motor operation is often at an intermediate motor speed. When desired, variable gearing can be used to cause the motor to operate in more efficient regions more of the time. Such gearing can readily be provided by a transmission and thus, there are potential advantages to using a transmission in conjunction with the described pulsed motor control. The transmission may have a set of gears or may be continuously variable or may have any other suitable form. In such embodiments, the motor controller or other suitable control component can be arranged to direct operation of the transmission in the desired manner Again, the use of a transmission can be beneficially employed in a wide variety of other (non-vehicle) related applications as well.

Although automotive applications have been used as an example of a vehicle propulsion application, it should be appreciated that the described control approach is equally beneficial in other propulsion related applications including: electric motors used in other types of vehicles including trucks, carts, motorcycles, bicycles, drones and other flying devices; in robots and other devices that move autonomously within an environment; etc.

Motors used in Heating, Ventilation and Air Conditioning (HVAC) applications are another good example of a market that can benefit from pulsed control. There are several factors that contribute to pulsed motor control being a good fit for HVAC applications. These include the facts that: (a) the motors used in HVAC applications today are predominantly induction motors that don't contain permanent magnets; (b) a high percentage of HVAC motors' operational lives are spent in operating regions below their high efficiency areas; and (c) the inertia of a fan or pump normally dominates the motor inertia—which tends to further mitigate potential NVH related impacts associated with pulsing.

Of course, motors are used in a wide variety of other applications in which they are operated at less than their optimal efficiency. This can be due to operating over a wide operating range (e.g., under a wide variety of different loads and/or motor speeds) or it can be due to the use of a motor that is oversized (or otherwise not designed specifically) for its application or any of a variety of other reasons. It should be apparent that the described control approach can be beneficial to any of these types of applications.

High-Low Torque Modulation

In most of the examples set forth above, pulsing is accomplished by modulating the torque between a higher (energy efficient) torque output level and a zero torque output level. Although that is believed to be the preferred approach in most pulsed control application, it is expected that there will be circumstances (e.g. specific machines/machine operating region) where it may be preferable to modulate between higher and lower, non-zero torque outputs rather than modulating between high and zero torque. For example, in some circumstances, High/Low pulsing may have better Noise, Vibration and Harshness (NVH) characteristics that on/off pulsing and thus there may be circumstances where a more desirable tradeoff between energy conversion efficiency and NVH characteristics may be attained by high/low pulsing than by on/off pulsing. In another example, for some operating regions of some motors, a high/low pulsing approach may provide better overall energy conversion efficiency than on/off pulsing. Motors that incorporate permanent magnets that require field weakening to generate zero torque are particularly good candidates for the use of high-low torque modulation.

Pulsed Motor Overdrive

Most motors have a designated maximum rated output level. Generally, the maximum rated output level is based on steady state operation and often the motor can be driven at higher output levels for brief periods of time without any adverse effects. In some embodiments, in selected operating regions, the output level of motor may be pulsed with the "on" levels being higher than the maximum rated continuous output level for steady state operation. For some motors in some potential operating ranges, there are several potential advantages to using overdrive pulses. For example, in some specific operating circumstances, the energy conversion efficiency of the motor or system (e.g., motor and inverter) at a given motor speed may be higher in certain overdrive regions than in "normal" operating regions, which means that pulsed operation at higher torque or power may be even more efficient.

Furthermore, more efficient operation typically leads to less heating, which potentially facilitates even higher net torque outputs. Thus, it is believed that if motors that are traditionally driven with continuous power (such as induction and other AC motors, brushless DC motors, switched reluctance motors, etc.) are designed with pulsed operation in mind, they can sometimes be optimized to attain higher net torque outputs using pulsed control than would be appropriate using more conventional steady/continuous drive power.

Other Motor Optimizations

There are a variety of factors that contribute to motor inefficiencies. One contributor relates to the power factor which is the cosine of the angle between the rotating voltage and current vectors. Ideally the voltage and current should be in phase or have a unity power factor. However for many types of electric motor/generator this ideal does not necessarily represent the highest system efficiency point for any given load and speed. When pulsed control of the motor as described herein is contemplated and the power factor correction is optimized taking into account the pulsed operating points, the effective power factor is expected to improve above that of traditional continuous motor operation.

Another factor that contributes to motor inefficiencies is sometimes referred to as resistive or $I^2R$ losses. Resistive losses heat the motor windings, which in turn further increases resistive losses, since winding resistivity generally increases with temperature. Resistive losses are non-linear—increasing with at least the square of the current. Therefore, resistive losses tend to have a higher impact on the overall motor efficiency at higher motor output levels—such as the levels used during pulsed operation. A rule-of-thumb for electric motor design is that the magnetic losses should approximately equal the resistive losses at the target set point of operation. Using the pulsed motor control method described herein may influence the design of or choice of an appropriate motor, since motor operating points below the most efficient operating point will generally not be used. In other words, the motor is driven either at substantially its most efficient operating point or at higher loads. Low load continuous operating need not be considered in the design or selection of the electric motor—which again can help further improve the system overall efficiency.

Another factor that contributes to motor inefficiency is sometimes referred to as the magnetic core losses—which relates to magnetic flux oriented losses. One loss mechanism is motor winding leakage reactance, which refers to magnetic flux lines that do not link between rotor and stator magnetic elements. Another magnetic core loss mechanism relates to hysteresis within magnetic iron cores and are often represented in a BH curve. Here B is the magnetic flux density and H is the magnetic field strength. They are related by the magnetization of the materials thru which the field passes, which for some motors, is the iron core(s) present in the rotor or stator. Again, a motor that is designed specifically for pulsed control can be optimized to mitigate magnetic core losses during pulsed motor operation.

As discussed above, transient switching losses associated with switching between motor "on" and motor "off" states during pulsing is another factor that impacts the efficiency of the motor during pulsed operation. As discussed above, one way to reduce these transient switching losses is to improve (shorten) the motor drive current rise and fall times associated with pulsing the motor on and off. Another way to help manage the transient switching losses is to manage the frequency of the pulsing. In general, the lower the switching frequency, the lower the transient switching losses will be. However there is a tradeoff here in that lower frequency switching can sometimes induce noise, vibration and harshness (NVH) that may be undesirable or unacceptable in certain applications. Thus, the pulsing frequency for any particular motor is preferably selected appropriately considering both motor efficiency and NVH concerns and/or requirements that are relevant to the motors intended application(s). Along these lines, it is noted the pulsing controllers that have noise shaping capabilities such as sigma delta conversion based pulsing controllers can be very helpful at mitigating NVH impacts associated with pulsed motor control and can therefore be helpful in supporting the use of generally lower switching frequencies.

It should be appreciated that the appropriate pulsing frequency for different motors may be very different based on the motor's construction, operating environment and operational range. For some motors, switching frequencies on the order of 10-50 kHz may be appropriate—whereas for other motors much lower switching frequencies, as for example 10-500 Hz range may be more appropriate. Still other electric machines may have switching frequencies between these ranges or above or below either of the stated ranges. The most appropriate pulsing frequency for any particular motor will depend on a variety of factors including motor size, on/off transient characteristics, NVH considerations, etc.

The selection of the desire drive point for any particular motor speed can also have an impact on the switching frequency. More specifically, many motors have relatively flat efficiency curves over a relatively broad operational range. In general, pulsed operation at a torque level that is slightly lower than the optimal efficiency point of continuous operation, can sometimes facilitate switching at a slightly lower frequency, which—depending on the nature of the switching losses—may result in a higher overall motor efficiency during pulsed operation. This emphasizes the point that the desired pulsed operation drive point associated with any particular motor speed is not necessarily the torque level that would be most efficient for continuous motor operation. Rather, in some circumstances, the most energy efficient point for pulsed operation may be slightly different than the most energy efficient point for continuous operation. Furthermore, NVH considerations and/or other operational or control considerations may affect the decision as to the drive point that is deemed appropriate for any particular motor speed.

Additional Embodiments

Although only a few embodiments of the invention have been described in detail, it should be appreciated that the invention may be implemented in many other forms without departing from the spirit or scope of the invention. The various described pulse controllers and other control elements may be implemented, grouped, and configured in a wide variety of different architectures in different embodiments. For example, in some embodiments, the pulse controller may be incorporated into a motor controller or an inverter controller or it may be provided as a separate component. Similarly, for a generator, the pulse controller may be incorporated into a generator controller or a rectifier controller and in combined motor/generators the pulse controller may be incorporated into a combined motor/generator controller or a combined inverter/rectifier controller. In some embodiments, the described control functionality may be implemented algorithmically in software or firmware executed on a processor—which may take any suitable form, including, for example, general purpose processors and microprocessors, DSPs, etc.

The pulse generator or machine controller may be part of a larger control system. For example, in vehicular applications, the described control may be part of a vehicle controller, a powertrain controller, a hybrid powertrain controller, or an ECU (engine control unit), etc. that performs a variety of functions related to vehicle control. In such applications, the vehicle or other relevant controller, etc. may take the form of a single processor that executes all of the required control, or it may include multiple processors that are co-located as part of a powertrain or vehicle control module or that are distributed at various locations within the vehicle. The specific functionalities performed by any one of the processors or control units may be widely varied.

The invention has been described primarily in the context of motor control and/or inverter/motor control. However, it should be appreciated that the described approach is equally applicable to generator and/or generator/rectifier control. Thus, any time that motor control is described it should be appreciated that analogous techniques can be applied to generator control. Thus, unless the context requires different interpretation, description of a feature of pulsed motor control, pulsed generator control or pulsed motor/generator control should be understood to apply equally to pulsed motor control, pulsed generator control and the pulsed control of combined motor/generators.

A variety of different control schemes can be implemented within the pulse controller 120. Generally, the control schemes may be implemented digitally, algorithmically, using analog components or using hybrid approaches. The pulse generator and/or the motor controller may be implemented as code executing on a processor, on programmable logic such as an FPGA (field programmable gate array), in circuitry such as an ASIC (application specific integrated circuit), on a digital signal processor (DSP), using analog components, or any other suitable piece of hardware. In some implementations, the described control schemes may be incorporated into object code to be executed on a digital signal processor (DSP) incorporated into an inverter controller (and/or rectifier controller in the context of a generator and/or a combined inverter/rectifier controller).

In some of the primary described embodiments, sigma delta control is used to create the pulsed control signal. Although sigma delta control is one particularly good way to create the pulsed control signal 124, it should be appreciated a variety of other control schemes may be used to create the pulsed control signal in other embodiments.

Regardless of the nature of the pulsing that is used, the torque modulation is preferably managed in a manner such that NVH that is unacceptable for the intended application is not produced.

The described pulsed motor control can be used in a wide variety of applications. The biggest efficiency gains will typically be seen in motors and generators that are not consistently driven at near their optimal operating efficiency. A good example of this is motors/generators that have a wide operational range and are intended for use under widely varying load conditions. Another good example is motors that are routinely under driven. For example, it is not uncommon for system designers to use larger motors than are actually required for an application—e.g., using a 100 hp motor when a 50 hp motor would be more than adequate for the assigned tasks. In many cases, the larger motor may run less efficiently at the reduced load and in such circumstances, pulsed control may improve the motors efficiency during use.

Therefore, the present embodiments should be considered illustrative and not restrictive and the invention is not to be limited to the details given herein, but may be modified within the scope and equivalents of the appended claims.

What is claimed is:

1. An electric machine system comprising:
   an alternating current electric machine;
   a power converter that takes the form of, or includes, at least one of an inverter and a rectifier; and
   a controller arranged to direct the power converter to cause pulsed operation of the electric machine to deliver a net average of a desired output, wherein during the pulsed operation of the electric machine, the controller causes the output of the electric machine to alternate on and off and turns the power converter off during at least portions of the times that the electric machine is pulsed off.

2. The electric machine system as recited in claim 1 wherein the controller turns the power converter off each time the electric machine is pulsed off.

3. The electric machine system as recited in claim 2 wherein the controller pulses the electric machine on and off at a frequency of at least ten times per second such that the power converter is turned off at least 10 times per second.

4. The electric machine system as recited in claim 1 wherein the electric machine outputs at a first output level that is higher than the desired output level during at least portions of the time that the electric machine is turned on and the first output level is selected such that the electric machine system has an overall higher energy conversion efficiency during the pulsed operation of the electric machine system than the electric machine system would have when the electric machine is driven continuous manner at a third output level to deliver the desired output.

5. The electric machine system as recited in claim 4 wherein the controller varies the first output level in accordance with variations in an operating speed of the electric machine.

6. The electric machine system as recited in claim 1 wherein a period between beginnings of sequential first output level pulses is a pulse cycle duration, and the controller is configured to direct the pulse cycle duration to vary during operation of the electric machine.

7. The electric machine system as recited in claim 6 wherein the pulse cycle duration varies as a function of a rotational speed of the electric machine.

8. An electric machine system comprising an electric machine, a power converter, and a controller arranged to direct the power converter to cause pulsed operation of the electric machine to deliver a net average of a desired output, wherein during the pulsed operation of the electric machine:
   the controller causes the output of the electric machine to alternate on and off and turns the power converter off during at least portions of the times that the electric machine is pulsed off;
   the electric machine outputs at a first output level that is higher than the desired output level during at least portions of the time that the electric machine is turned on and the first output level is selected such that the electric machine system has an overall higher energy conversion efficiency during the pulsed operation of the electric machine system than the electric machine system would have when the electric machine is driven continuous manner at a third output level to deliver the desired output;
   the controller varies the first output level in accordance with variations in an operating speed of the electric machine and the first output level for a given operational speed is chosen to optimize the electric machine system's energy conversion efficiency at the given operational speed.

9. A method of operating an alternating current electric machine system, the method comprising directing a power converter, that is or includes at least one of an inverter or a rectifier to cause pulsed operation of the electric machine to deliver a net average of a desired output, wherein during the pulsed operation of the electric machine, a controller causes the output of the electric machine to alternate on and off and turns the power converter off during at least portions of the times that the electric machine is pulsed off, wherein the output level of the electric machine during the on pulses varies as a function of an operating speed of the electric machine and is selected to improve the energy conversion efficiency of the electric machine system during the pulsed operation of the electric machine relative to an energy conversion efficiency that the electric machine system would have when the electric machine is driven in a continuous manner at a second output level to deliver the desired output.

10. The method as recited in claim 9 wherein the power converter is turned off each time the electric machine is pulsed off.

11. The method as recited in claim 9 wherein the electric machine is pulsed on and off at a frequency of at least ten times per second such that the power converter is turned off at least 10 times per second.

12. The method as recited in claim 9 wherein the electric machine outputs at a first output level that is higher than the desired output level during at least a portion of the time that the electric machine is turned on and the first output level is selected such that the electric machine system has an overall higher energy conversion efficiency during the pulsed operation of the electric machine system than the electric machine system would have when the electric machine is driven continuous manner at a third output level to deliver the desired output.

13. An electric machine system comprising:
an electric machine;
a power converter; and
a controller arranged to direct the power converter to cause pulsed operation of the electric machine to deliver a net average of a desired output, wherein during the pulsed operation of the electric machine, the output of the electric machine alternates between a first output level and a second output level that is lower than the first output level, wherein the first output level varies as a function of an operating speed of the electric machine and the first and second output levels are selected such that an energy conversion efficiency of the electric machine system including at least the electric machine and the power converter is optimized during the pulsed operation of the electric machine based at least in part on a combined energy conversion efficiency of the power converter and the electric machine.

14. The electric machine system as recited in claim 13 wherein the second output level is substantially zero torque.

15. The electric machine system as recited in claim 14 wherein the electric machine is turned off during at least portions of the times that the electric machine outputs substantially zero torque.

16. The electric machine system as recited in claim 15 wherein the electric machine is permanent magnet type electric machine.

17. The electric machine system as recited in claim 16 wherein
the controller turns the power converter off each time the electric machine is pulsed off; and
the controller is configured to cause the electric machine to be pulsed at a frequency of at least 100 times per second such that the power converter is turned off at least 100 times per second.

18. The electric machine system as recited in claim 14 wherein the power converter controls the electric machine to output substantially zero torque during at least a first portion of the time that the electric machine outputs substantially zero torque.

19. The electric machine as recited in claim 18 wherein the electric motor is an induction machine or a synchronous AC electric machine that does not include permanent magnet.

20. The electric machine system as recited in claim 18 wherein the power converter controls the electric machine to output substantially zero torque during at least a second portion of the time that the electric machine outputs substantially zero torque.

21. The electric machine system as recited in claim 13 wherein a period between beginnings of sequential first output level pulses is a pulse cycle duration, and the pulse cycle duration varies during operation of the electric machine.

22. The electric machine system as recited in claim 21 wherein the pulse cycle duration varies as a function of a rotational speed of the electric machine.

23. The electric machine system as recited in claim 13 wherein the electric machine is a motor and the power converter includes an inverter.

24. The electric machine system as recited in claim 13 wherein the electric machine is a generator and the power converter includes a rectifier.

25. The electric machine system as recited in claim 13 wherein the electric machine is configured to operate as a motor/generator.

26. An electric machine system comprising:
an electric machine;
a power converter;
a battery that supplies power to the power converter and receives power from the power converter, and
a controller arranged to direct the power converter to cause pulsed operation of the electric machine to deliver a net average of a desired output, wherein during the pulsed operation of the electric machine, the output of the electric machine alternates between a first output level and a second output level that is lower than the first output level, wherein the first output level varies as a function of an operating speed of the electric machine and the first and second output levels are selected such that an energy conversion efficiency of the electric machine system including at least the electric machine and the power converter is optimized during the pulsed operation of the electric machine considering at least an energy conversion efficiency of the power converter and an energy conversion efficiency of the electric machine and wherein the first and second output levels are selected for optimal energy conversion efficiency of the electric machine system taking into further consideration losses associated with transferring electrical power between the battery and the power converter.

* * * * *